United States Patent
Park et al.

(10) Patent No.: US 8,593,057 B2
(45) Date of Patent: Nov. 26, 2013

(54) ORGANIC ELECTROLUMINESCENT DISPLAY DEVICE

(75) Inventors: Jong-Hyun Park, Seoul (KR); Juhn-Suk Yoo, Goyang-si (KR); Jong-Sung Kim, Paju-si (KR); Kang-Ju Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/227,271

(22) Filed: Sep. 7, 2011

(65) Prior Publication Data
US 2012/0056531 A1  Mar. 8, 2012

(30) Foreign Application Priority Data

Sep. 8, 2010 (KR) .......................... 10-2010-0088059

(51) Int. Cl.
*G09G 5/02* (2006.01)
*H01J 1/62* (2006.01)
(52) U.S. Cl.
USPC .......................................... 313/504; 345/695
(58) Field of Classification Search
USPC .......................................... 313/504; 345/695
See application file for complete search history.

(56) References Cited

U.S. PATENT DOCUMENTS

| 2005/0225232 | A1* | 10/2005 | Boroson et al. | 313/504 |
| 2007/0064020 | A1* | 3/2007 | Credelle et al. | 345/694 |
| 2009/0121983 | A1* | 5/2009 | Sung et al. | 345/76 |
| 2009/0195144 | A1* | 8/2009 | Kitabayashi | 313/503 |
| 2009/0322215 | A1 | 12/2009 | Sung et al. | |
| 2011/0180825 | A1 | 7/2011 | Lee et al. | |

FOREIGN PATENT DOCUMENTS

| EP | 2 390 869 A2 | 11/2011 |
| JP | 2007-018902 A | 1/2007 |
| KR | 10-2009-0003620 A | 1/2009 |
| KR | 10-2009-0049515 A | 5/2009 |
| KR | 10-2010-0001598 A | 1/2010 |
| KR | 10-2010-0119653 A | 11/2010 |
| WO | WO 2011/068761 A1 | 6/2011 |

* cited by examiner

*Primary Examiner* — Anh Mai
*Assistant Examiner* — Michael Santonocito
(74) *Attorney, Agent, or Firm* — Birch, Stewart, Kolasch & Birch, LLP

(57) ABSTRACT

An organic electroluminescent display device including first to fourth pixel regions each including red, green and blue sub-pixel regions, each of the first to fourth pixel regions being divided into first and second column, and the first column being divided into first and second rows, wherein a red sub-pixel region and a green sub-pixel region are respectively arranged in the first and second rows, and a blue sub-pixel region is arranged in the second column; a red emitting layer formed in the red sub-pixel region; a green emitting layer formed in the green sub-pixel region; and a blue emitting layer formed in the blue sub-pixel region.

10 Claims, 16 Drawing Sheets

ORGANIC ELECTROLUMINESCENT DISPLAY DEVICE

The present application claims the priority benefit of Korean Patent Application No. 10-2010-0088059 filed in Republic of Korea on Sep. 8, 2010, which is herein incorporated by reference.

BACKGROUND OF THE INVENTION

1. Technical Field

The present invention relates to an organic electroluminescent display (OELD) device, and more particularly, to an OELD device having a high aperture ratio and a high resolution.

2. Related Art

An OELD device of new flat panel display devices is a self-emitting type. The OELD device has excellent characteristics of a view angel, a contrast ratio and so on. Also, since the OELD device does not require a backlight assembly, the OELD device has low weight and low power consumption. Moreover, the OELD device has advantages of a high response rate, a low production cost and so on. In addition, all elements of the OELD device are a solid phase, the device is strong against an outer impact. Particularly, there is a big advantage in a production cost. A fabricating process of the OELD device is very simple and requires a deposition apparatus and an encapsulating apparatus. The OLED device may be called to as an organic light emitting diode device.

In an active matrix type OELD device, a voltage for controlling an electric current of a pixel is charged in a storage capacitor such that a level of the electric current is maintained to next frame.

FIG. 1 is a circuit diagram of one sub-pixel region of the related art OELD device. As shown in FIG. 1, an OELD device includes a gate line "GL", a data line "DL", a power supply line "PL", a switching thin film transistor (TFT) "Ts", a storage capacitor "Cst", a driving TFT "Td", and an emitting diode "Del". The gate line "GL" and the data line "DL" cross each other to define a sub-pixel region "SP". The switching TFT "Ts" is connected to the gate and data line "GL" and "DL", the driving TFT "Td" and the storage capacitor "Cst" are connected to the switching TFT "Ts" and the power line "PL". The emitting diode "Del" is connected to the driving TFT "Td".

When the switching TFT "Ts" is turned on by a gate signal applied through the gate line "GL", a data signal from the data line "DL" is applied to the gate electrode of the driving TFT "Td" and an electrode of the storage capacitor "Cst". When the driving TFT "Td" is turned on by the data signal, an electric current is supplied to the emitting diode "Del" from the power line "PL". As a result, the emitting diode "Del" emits light. In this case, when the driving TFT "Td" is turned on, a level of an electric current applied from the power supply line "PL" to the emitting diode "Del" is determined such that the emitting diode "Del" can produce a gray scale. The storage capacitor "Cst" serves to maintain the voltage of the gate electrode of the driving TFT "Td" when the switching TFT "Ts" is turned off. Accordingly, even if the switching TFT "Ts" is turned off, a level of an electric current applied from the power supply line "PL" to the emitting diode "Del" is maintained to next frame.

To produce full color images, the OELD device includes red, green and blue sub-pixel regions in one pixel region. FIG. 2 is a schematic view showing pixel regions of the related art OELD device. As shown in FIG. 2, the OELD device 10 includes a plurality of pixel regions "P". Each pixel region "P" includes red, green and blue sub-pixel regions "SPr", "SPg" and "SPb".

Each pixel region "P" has a rectangular shape to have a horizontal length "H" and a vertical length "V". The red, green and blue sub-pixel regions "SPr", "SPg" and "SPb" are arranged in each pixel region "P" along a horizontal direction or a vertical direction. For example, each of the red, green and blue sub-pixel regions "SPr", "SPg" and "SPb" has a horizontal length corresponding to ⅓ of the horizontal length "H" of the pixel region "P" and a vertical length corresponding to the vertical length "V" of the pixel region "P".

Red, green and blue emitting layers 32, 34 and 36 are respectively formed in the red, green and blue sub-pixel regions "SPr", "SPg" and "SPb". The red, green and blue emitting layers 32, 34 and 36 constitute the emitting diode "Del" with first and second electrodes (not shown). When the emitting layers are closely disposed, a shadowing problem, i.e., a color mixture in adjacent sub-pixel regions, is generated. Accordingly, each of the emitting layers 32, 34 and 36 has a width "w", i.e., a horizontal length, and a height "h", i.e., a vertical length, and is spaced apart from each other by a first distance "d1".

The red, green and blue emitting layers 32, 34 and 36 are formed by a thermal deposition using a shadow mask. In FIG. 2, the red, green and blue emitting layers 32, 34 and 36 are overlapped portions of the first and second electrodes.

An area of the red, green and blue emitting layers 32, 34 and 36 may be larger than that in FIG. 2. However, since an area of the red, green and blue emitting layers 32, 34 and 36 corresponding to the overlapped portions of the first and second electrodes is effective emitting portions, the red, green and blue emitting layers 32, 34 and 36 corresponding to the overlapped portions are shown.

The OELD device 10 display full color images using the red, green and blue emitting layers 32, 34 and 36 in the red, green and blue sub-pixel regions "SPr", "SPg" and "SPb".

Recently, to meet requirement for a high resolution, an area of one pixel region "P" and an area of each of the red, green and blue sub-pixel regions "SPr", "SPg" and "SPb" are reduced.

As a result, an area for the red, green and blue emitting layers 32, 34 and 36 is also reduced. The height "h" of each of the red, green and blue emitting layers 32, 34 and 36 substantially corresponds to the vertical length "V" of the pixel region "P" such that there is no problem. However, since the width "w" of each of the red, green and blue emitting layers 32, 34 and 36 corresponds to the horizontal length "H" of the pixel region "P", there is a limitation in reducing the width "w".

Namely, the first distance "d1" between adjacent emitting layers for preventing the shadowing problem should be maintained when an area of the pixel region "P" is reduced because of the requirement of a high resolution.

Accordingly, with a high resolution of the OELD device, an area for the red, green and blue emitting layers 32, 34 and 36 is rapidly reduced such that it is difficult to fabricate a fine shadow mask for forming the red, green and blue emitting layers 32, 34 and 36.

SUMMARY OF THE INVENTION

Accordingly, the present invention is directed to an OELD device that substantially obviates one or more of the problems due to limitations and disadvantages of the related art.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

In accordance with the present invention, as embodied and broadly described herein, an organic electroluminescent display device including first to fourth pixel regions each including red, green and blue sub-pixel regions, each of the first to fourth pixel regions being divided into first and second column, and the first column being divided into first and second rows, wherein a red sub-pixel region and a green sub-pixel region are respectively arranged in the first and second rows, and a blue sub-pixel region is arranged in the second column; a red emitting layer formed in the red sub-pixel region; a green emitting layer formed in the green sub-pixel region; and a blue emitting layer formed in the blue sub-pixel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENTS

Reference will now be made in detail to the preferred embodiments of the present invention, examples of which are illustrated in the accompanying drawings.

Figure 1:
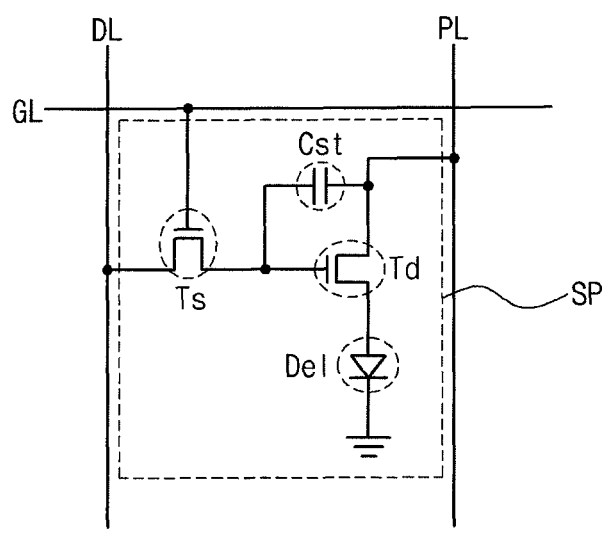
FIG. 1 is a circuit diagram of one sub-pixel region of the related art OELD device.
Figure 2:
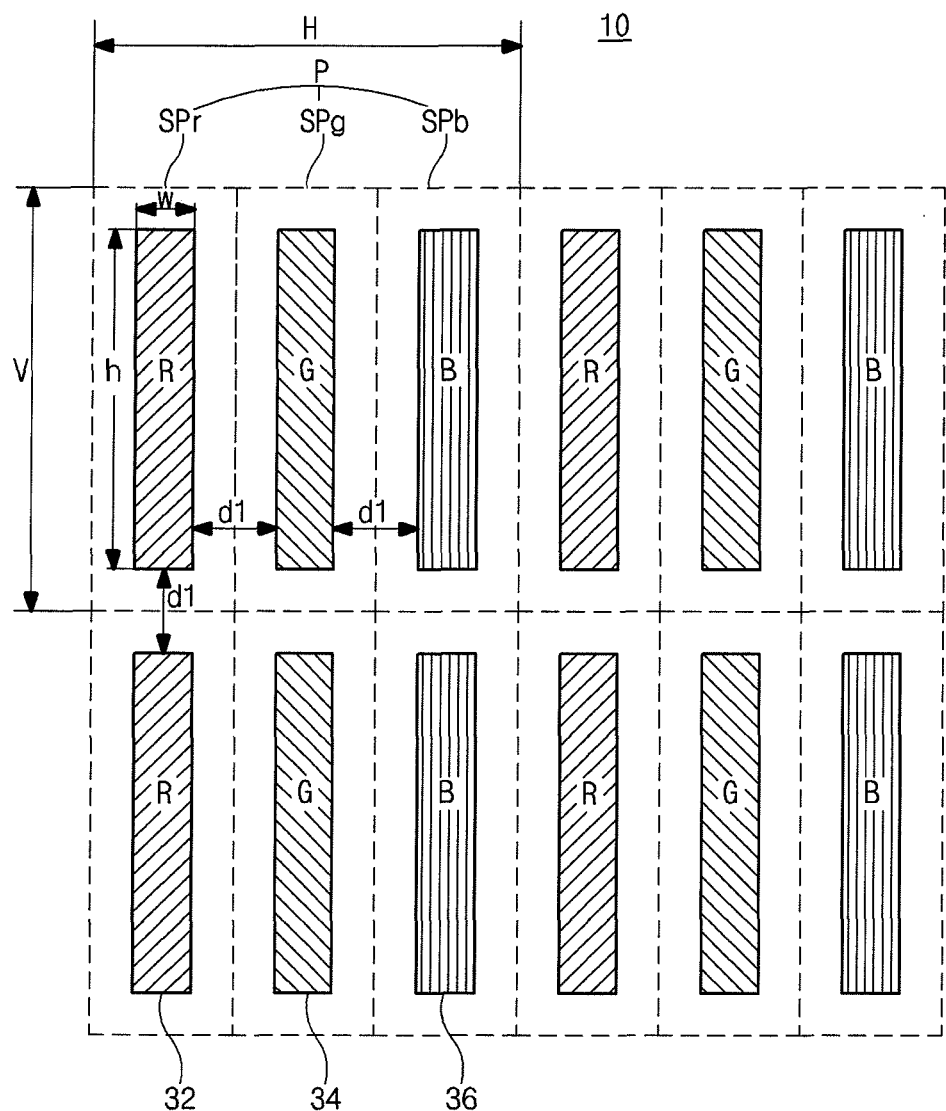
FIG. 2 is a schematic view showing pixel regions of the related art OELD device.
Figure 3:
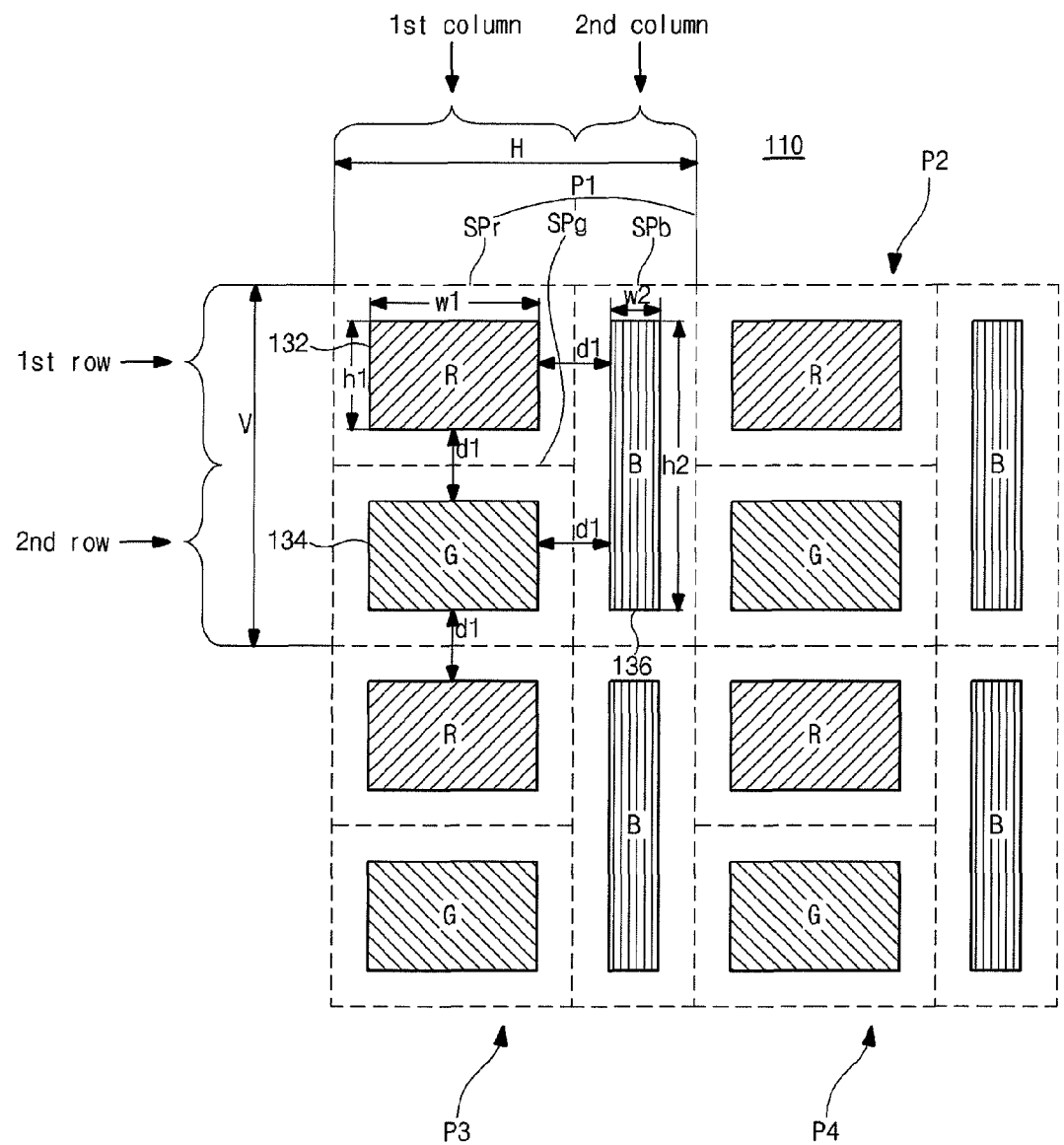
FIG. 3 is a schematic view showing pixel regions of an OELD device according to a first embodiment of the present invention.

FIG. 3 is a schematic view showing pixel regions of an OELD device according to a first embodiment of the present invention.

As shown in FIG. 3, an OELD device 110 includes first to fourth pixel regions "P1", "P2", "P3" and "P4" arranged in a matrix shape. Each of the first to fourth pixel regions "P1" to "P4" includes red, green and blue sub-pixel regions "SPr", "SPg" and "SPb".

Each of the first to fourth pixel regions "P1" to "P4" has a rectangular shape to have a horizontal length "H" and a vertical length "V". The red and green sub-pixel regions "SPr" and "SPg" are alternately arranged with each other in a first column of each of the first to fourth pixel regions "P1" to "P4", and the blue sub-pixel region "SPb" is arranged in a second column of each of the first to fourth pixel regions "P1" to "P4".

Each of the first to fourth pixel regions "P1" to "P4" is divided into the first and second columns along a horizontal direction, and the first column is divided into first and second rows along a vertical direction. The red sub-pixel region "SPr" is positioned in the first column and the first row, and the green sub-pixel region "SPg" is positioned in the first column and the second row. Namely, the red and green sub-pixel regions "SPr" and "SPg" are alternately arranged with each other in the pixel regions adjacent along the vertical direction. In other words, the red and green sub-pixel regions "SPr" and "SPg" are alternately arranged in the first column of the first and third pixel regions "P1" and "P3". In addition, the red and green sub-pixel regions "SPr" and "SPg" are alternately arranged in the first column of the second and fourth pixel regions "P2" and "P4". As a result, in the first column, one green sub-pixel region "SPg" is positioned between two adjacent red sub-pixel regions "SPr". The blue sub-pixel region "SPb" is positioned in the second column. Red, green and blue emitting layers 132, 134 and 136 are respectively formed in the red, green and blue sub-pixel regions "SPr", "SPg" and "SPb".

Figure 5:
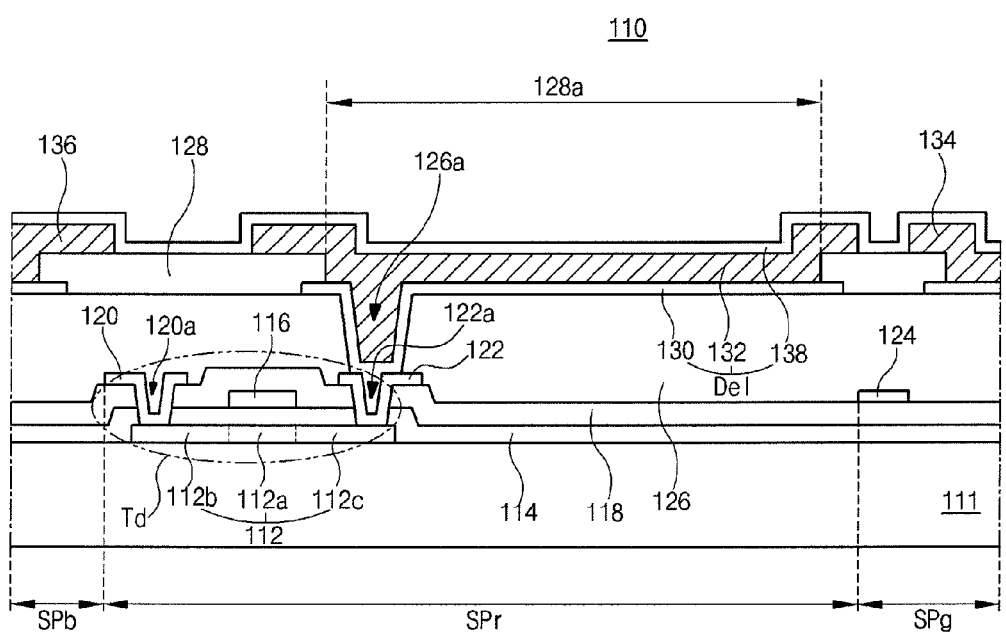
FIG. 5 is a cross-sectional view of a sub-pixel region of an OELD device according to the first embodiment of the present invention.

The red, green and blue emitting layers 132, 134 and 136 constitute an emitting diode "Del" (of FIG. 5) with a first electrode 130 (of FIG. 5) and a second electrode 138 (of FIG. 5). To prevent the shadowing problem, the emitting layers 132, 134 and 136 are spaced apart from each other by a first distance "d1". For example, the first distance "d1" may be about 22 micrometers.

Each of the red and green emitting layers 132 and 134 has a first width "w1", i.e., a horizontal length, and a first height "h1", i.e., a vertical length. The blue emitting layer 136 has a second width "w2" and a second height "h2". Namely, each of the red, green and blue emitting layers 132, 134 and 136 has a rectangular shape. The red and green sub-pixel regions "SPr" and "SPg" are positioned in the first and second rows of the first column such that the first width "w1" is larger than the first height "h1". On the contrary, the blue sub-pixel region "SPb" is positioned in an entire of the second column such that the second width "w2" is smaller than the second height "h2".

The red, green and blue emitting layers 132, 134 and 136 are formed by a thermal deposition using a shadow mask. In FIG. 3, the red, green and blue emitting layers 132, 134 and 136 are overlapped portions of the first and second electrodes.

An area of the red, green and blue emitting layers 132, 134 and 136 may be larger than that in FIG. 3. However, since an area of the red, green and blue emitting layers 132, 134 and 136 corresponding to the overlapped portions of the first and second electrodes 130 and 138 is effective emitting portions, the red, green and blue emitting layers 132, 134 and 136 corresponding to the overlapped portions are shown.

Particularly, when the first electrode 130 is exposed through an opening 128a (of FIG. 5) of a bank 128 (of FIG. 5), the red, green and blue emitting layers 132, 134 and 136 contact the exposed portion of the first electrode 130 and the second electrode 138 is formed on an entire surface of the red, green and blue emitting layers 132, 134 and 136 as one-body, the overlapped portion of the first and second electrodes 130 and 138 may be equal to the opening 128a of the bank 128.

As mentioned above, in the OELD device 110 according to the first embodiment of the present invention, each of the first pixel regions "P1" to "P4" is divided into the first and second columns, and the first column is divided into the first and second rows. Then, the red and green sub-pixel regions "SPr" and "SPg" are respectively disposed in regions defined by the first column and the first and second rows, and the blue sub-pixel region "SPb" is disposed in a region defined by the second column. In addition, the red, green and blue emitting layers 132, 134 and 136 are formed in the red, green and blue sub-pixel regions "SPr", "SPg" and "SPb", respectively.

Accordingly, with compared to the related art OELD device, where three sub-pixel regions are arranged along a direction, there is a margin in reduction of the width of the sub-pixel regions. As a result, there is a margin for requirement of a high resolution. Namely, when an area, e.g., a width, of the red, green and blue sub-pixel regions "SPr", "SPg" and "SPb" is reduced with requirement of a high resolution, there is a margin in reduction of the width of the red, green and blue sub-pixel regions "SPr", "SPg" and "SPb" such that a shadow mask for forming the red, green and blue emitting layers 132, 134 and 136 is easily fabricated.

Figure 4:
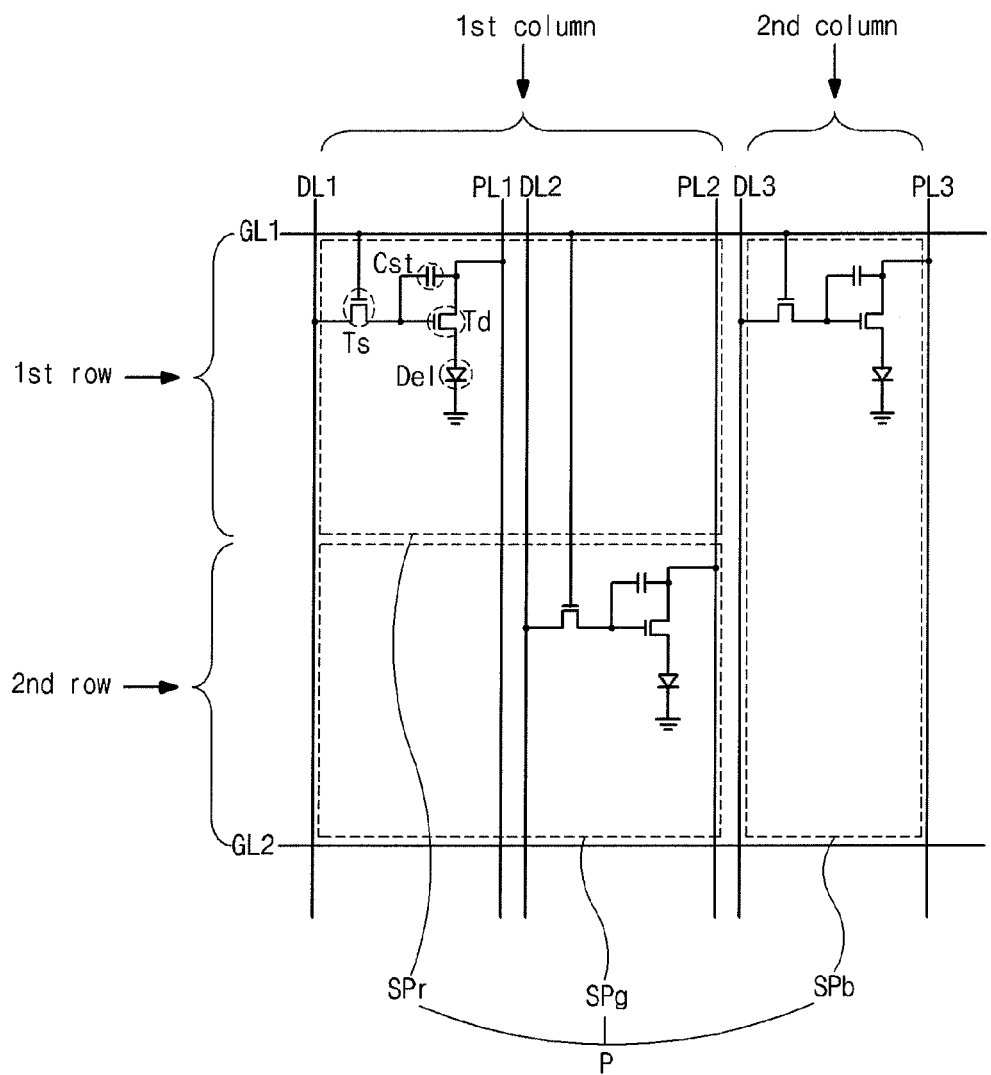
FIG. 4 is a circuit diagram of one pixel region of an OELD device according to the first embodiment of the present invention.

FIG. 4 is a circuit diagram of one pixel region of an OELD device according to the first embodiment of the present invention, and FIG. 5 is a cross-sectional view of a sub-pixel region of an OELD device according to the first embodiment of the present invention.

As shown in FIG. 4, the OELD device 110 includes first and second gate lines "GL1" and "GL2", first to third data lines "DL1", "DL2" and "DL3" and first to third power lines "PL1", "PL2" and "PL3". A region surrounded by the first and second gate lines "GL1" and GL2", the first data line "DL1" and the third power line "PL3" is defined as a pixel region The pixel region "P" is divided into the first and second columns, and the first column is divided into the first and second rows. The red and green sub-pixel regions "SPr" and "SPg" are defined in the first and second rows of the first column, respectively, and the blue sub-pixel region "SPb" is defined in the second column.

In each of the red, green and blue sub-pixel regions "SPr", "SPg" and "SPb", a switching TFT "Ts", a driving TFT "Td", a storage capacitor "Cst" and an emitting diode "Del" are formed. A position of the switching TFT "Ts", the driving TFT "Td" and the storage capacitor "Cst" is not limited in the respective sub-pixel region. For example, the switching TFT "Ts", the driving TFT "Td" and the storage capacitor "Cst" as elements of the red sub-pixel region "SPr" may be positioned in the green sub-pixel region "SPg" or the blue sub-pixel region "SPb".

In FIG. 4, the first power line "PL1", the second data line "DL2", the second power line "PL2" and the third data line "DL3" are positioned in order between the first data line "DL1" and the third power line "PL3". However, there is no limitation in the data lines "DL1" to "DL3" and the power lines "PL1" to "PL3". For example, the second data line "DL2" is positioned in a position of the second power line "PL2" without the second power line "PL2", and the driving TFT "Td" in the green sub-pixel region "SPg" is connected to the first power line "PL1". Namely, the red and green sub-pixel regions "SPr" and "SPg" share the first power line "PL1" without the second power line "DL2".

In FIG. 4, the switching TFT "Ts", the driving TFT "Td", the storage capacitor "Cst" and the emitting diode "Del" in the red sub-pixel region "SPr" is driven by signals from the first gate line "GL1" and the first data line "DL1", and the driving TFT "Td", the storage capacitor "Cst" and the emitting diode "Del" in the green sub-pixel region "SPg" is driven by signals from the first gate line "GL1" and the second data line "DL1". The driving TFT "Td", the storage capacitor "Cst" and the emitting diode "Del" in the blue sub-pixel region "SPb" is driven by signals from the first gate line "GL1" and the third data line "DL3", Referring to FIG. 5, the OELD device 110 includes a substrate 111 of glass or plastic, the driving TFT "Td" over the substrate 111, and the emitting diode "Del" connected to the driving TFT "Td".

Although not shown, on the substrate 111, the gate lines "GL1" and "GL2" (of FIG. 4), the data lines "DL1" to "DL3" (of FIG. 4), the power lines "PL1" to "PL3" (of FIG. 4), and the switching TFT "Ts" are formed.

In more detail, on the substrate 111, a semiconductor layer 112 including an active region 112a, a source region 112b and a drain region 112c is formed, and a gate insulating layer 114 covering an entire surface of the substrate 111 is formed to cover the semiconductor layer 112.

The semiconductor layer 112 is formed of a semiconductor material, for example, amorphous silicon or polycrystalline silicon. The active region 112a is formed of intrinsic silicon, and each of the source and drain regions 112b and 112c is formed of impurity-doped silicon. The gate insulating layer 114 may be formed of an inorganic insulating material, for example, silicon oxide or silicon nitride.

A gate electrode 116 is formed on the gate insulating layer 114 to correspond to the semiconductor layer 112, and an interlayer insulating layer 118 is formed on an entire surface of the substrate 111 to cover the gate electrode 116. The gate electrode 116 may be formed of a conductive metallic material, for example, aluminum (Al) or Al alloy. The interlayer insulating layer 118 may be formed of an inorganic insulating material, for example, silicon oxide or silicon nitride, or an organic insulating material, for example, benzocyclobutene or acrylic resin. The interlayer insulating layer 118 includes a source region contact hole 120a exposing the source region 112b and a drain region contact hole 120b exposing the drain region 112c.

A source electrode 120, the drain electrode 122 and a data line 124 are formed on the interlayer insulating layer 118. The source electrode 120 is connected to the source region 112b through the source region contact hole 120a, and the drain electrode 122 is connected to the drain region 112c through the drain region contact hole 120b.

The semiconductor layer 112, the gate electrode 116, the source electrode 120 and the drain electrode 122 constitute the driving TFT "Td". Although not shown, the switching TFT "Ts" may have substantially the same structure as the driving TFT "Td". The gate line is formed of the same material and at the same layer as the gate electrode 116.

A passivation layer 126 is formed on an entire surface of the substrate 111 to cover the driving TFT "Td". The passivation layer 126 may be formed an inorganic insulating material, for example, silicon oxide or silicon nitride, or an organic insulating material, for example, benzocyclobutene or acrylic resin. The passivation layer 126 includes a drain electrode contact hole 126a exposing the drain electrode 122.

The first electrode 130 is formed on the passivation layer 126 to correspond to the pixel region "P". The first electrode 130 is connected to the drain electrode 122 through the drain electrode contact hole 126a.

A bank 128 is formed at a boundary of the first electrode 130. The bank 128 includes an opening 128a exposing the first electrode 130. The bank 128 may be formed of an inorganic insulating material, for example, silicon oxide or silicon nitride, or an organic insulating material, for example, benzocyclobutene or acrylic resin.

On the first electrode 130 and in the opening 128a, the red, green and blue emitting layers 132, 134 and 136 are formed in the red, green and blue sub-pixel regions "SPr", "SPg" and "SPb", respectively. The second electrode 138 is formed on an entire surface of the substrate 222 to cover the red, green and blue emitting layers 132, 134 and 136.

The first electrode 130, each of the emitting layers 132, 134 and 136, and the second electrode 138 constitute the emitting diode "Del", and the first and second electrodes 130 and 138 are formed of conductive materials having different work functions.

An electron and a hole are provided into a portion of each of the emitting layers 132, 134 and 136, which contacts the first electrode 130, such that the portion of the each of the emitting layers 132, 134 and 136 emits light. When an emitting area, by which an aperture ratio is determined, of each of the red, green and blue emitting layers 132, 134 and 136 respectively in the red, green and blue sub-pixel regions "SPr", "SPg" and "SPc" is considered, an important fact is an exposed area of the first electrode 130 through the opening 128a of the bank 128. Accordingly, the red, green and blue emitting layers 132, 134 and 136 corresponding to the opening 128a of the bank 128 are shown in FIG. 3.

The first and second electrodes 130 and 138 respectively serve as an anode and a cathode. One of the first and second electrodes 130 and 138 serving the anode has a higher work function than the other of the first and second electrodes 130 and 138. For example, the anode may be formed of indium-tin-oxide (ITO), and the cathode may be formed of aluminum.

Each of the emitting layers 132, 134 and 136 may includes an electron injection layer (EIL), an emitting material layer (EML) and a hole injection layer (HIL) to improve an emission efficiency. Another substrate for encapsulation is attached to the substrate 111 such that the OELD 110 is obtained.

Figure 6A:
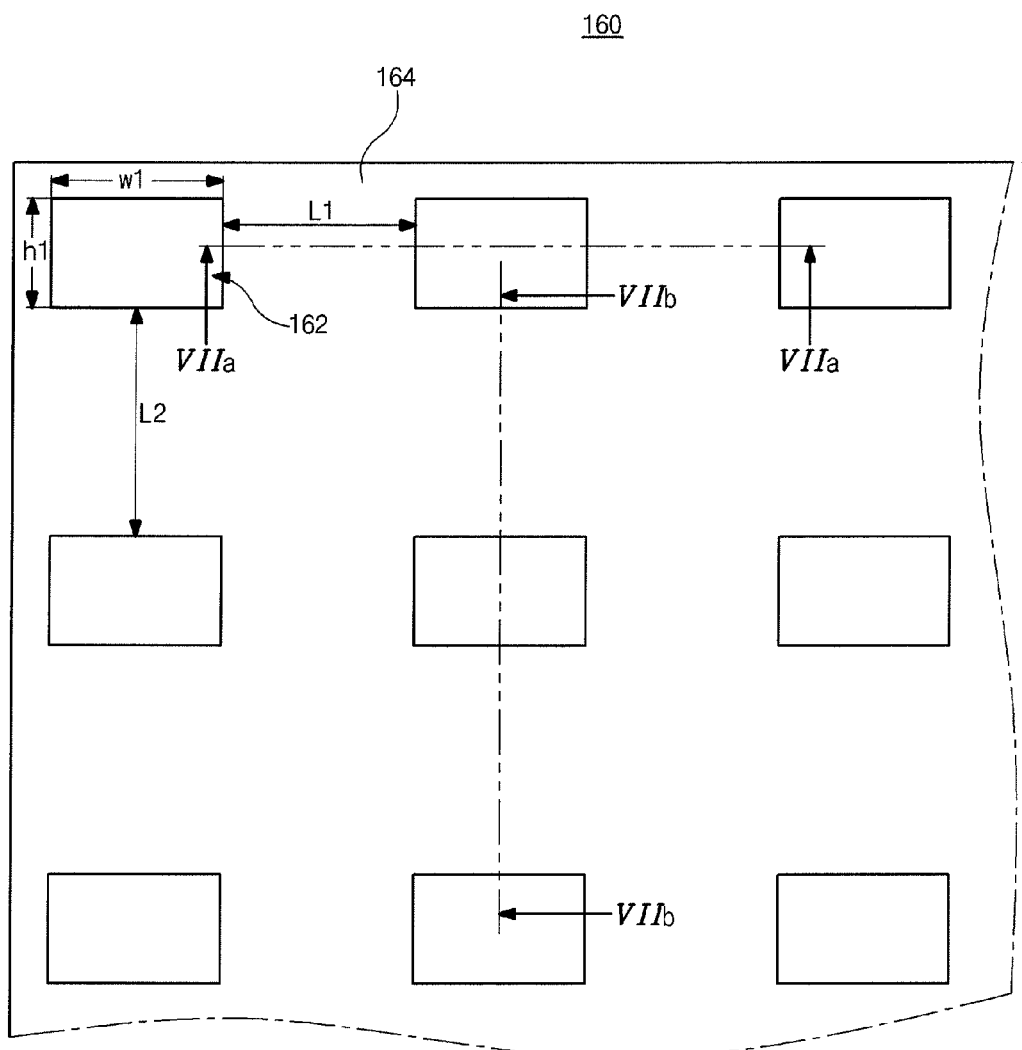
FIG. 6A is a view showing a shadow mask used for red and green emitting layers of an OELD device according to the first embodiment of the present invention.
Figure 6B:
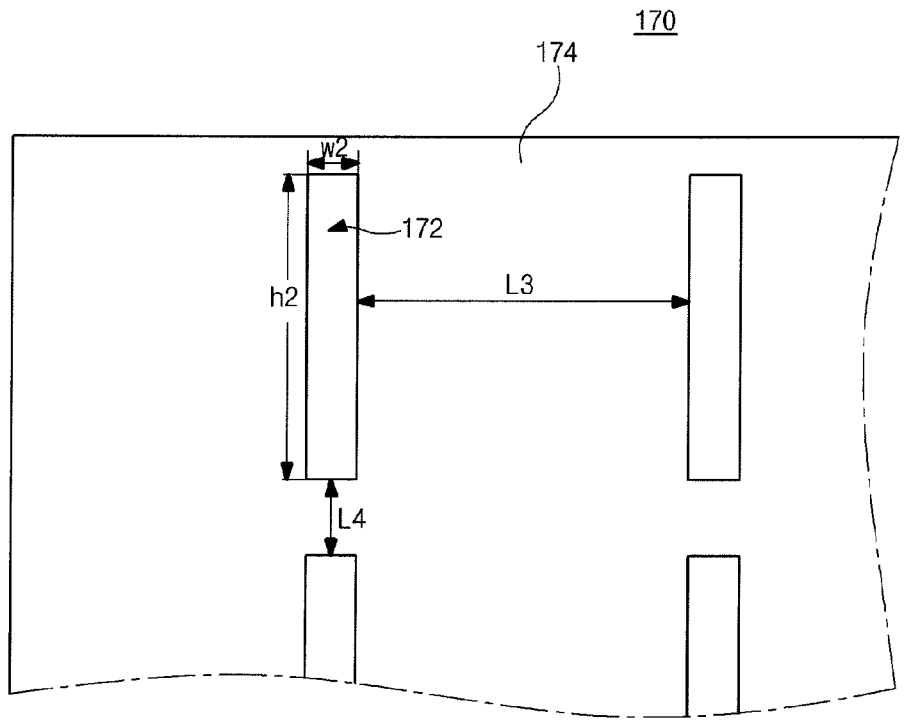
FIG. 6B is a view showing a shadow mask used for a blue emitting layers of an OELD device according to the first embodiment of the present invention.

A shadow mask for forming the red, green and blue emitting layers 132, 134 and 136 is illustrated with reference to FIGS. 6A and 6B with FIG. 3. FIG. 6A is a view showing a shadow mask used for red and green emitting layers of an OELD device according to the first embodiment of the present invention, and FIG. 6B is a view showing a shadow mask used for a blue emitting layers of an OELD device according to the first embodiment of the present invention.

As shown in FIG. 6A, a first shadow mask 160, which is used for forming the red emitting layer 132 and/or the green emitting layer 134, includes a plurality of first opening portions 162 for transmitting an emitting material and a first blocking portion 164. The first blocking portion 164 surrounds the first opening portions 162 and blocks the emitting material.

An align position of the first shadow mask 160 for the red emitting layer 132 is different from an align position of the first shadow mask 160 for the green emitting layer 134. The first shadow mask 160 is moved along a vertical direction or a horizontal direction to form one of the red and green emitting layers 132 and 134 after forming the other of the red and green emitting layers 132 and 134.

Each of the first opening portions 162 corresponds to the red emitting layer 132 or the green emitting layer 134 in each of the pixel region "P1" to "P4". Each of the first opening portions 162 has a size substantially equal to the first width "w1" and the first height "h1". Accordingly, adjacent first opening regions 162 along a horizontal direction are spaced apart from each other by a first length "L1" corresponding to a summation of the second width "w2" of the blue emitting layer 136 and twice of the first distance "d1". (L1~w2+2*d1) In addition, adjacent first opening portions 162 along a vertical direction are spaced apart from each other by a second length "L2" corresponding to a summation of the first height "h1" of the red emitting layer 132 or the green emitting layer 134 and twice of the first distance "d1". (L2~h1+2*d1) The first length "L1" may be smaller than the second length "L2". Alternatively, each of the first opening portions 162 has a size larger the first width "w1" and the first height "h1".

On the other hand, as shown in FIG. 6B, a second shadow mask 170, which is used for forming the blue emitting layer 136, includes a plurality of second opening portions 172 for transmitting an emitting material and a second blocking portion 174. The second blocking portion 174 surrounds the second opening portions 172 and blocks the emitting material.

Each of the second opening portions 172 corresponds to the blue emitting layer 136 in each of the pixel regions "P1" to "P4". Each of the second opening portions 172 has a size substantially equal to the second width "w2" and the second height "h2". Accordingly, adjacent second opening regions 172 along a horizontal direction are spaced apart from each other by a third length "L3" corresponding to a summation of the first width "w1" of the red emitting layer 132 or the green emitting layer 134 and twice of the first distance "d1". (L3~w1+2*d1) In addition, adjacent second opening regions 172 along a vertical direction are spaced apart from each other by a fourth length "L4" corresponding to the first distance "d1". (L4~d1) Alternatively, each of the second opening portions 172 has a size larger the second width "w2" and the second height "h2".

Unfortunately, when the resolution of the OELD device is further increased, a length or a distance between adjacent first opening portions 162 or between the adjacent second opening portions 172 is reduced such that a twisted problem is generated. Particularly, when the first and second lengths "L1" and "L2" between the first opening portions 162 of the first shadow mask 160 are decreased, thicknesses of the first blocking portion 164 is differently decreased such that the twisted problem becomes serious. This problem is illustrated with reference to FIGS. 7A and 7B with FIG. 6A.

Figure 7A:
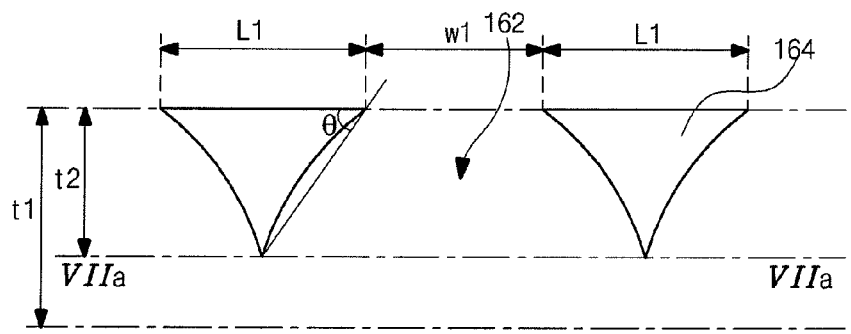
FIGS. 7A and 7B are cross-sectional views taken along the lines VIIa-VIIa and VIIb-VIIb in FIG. 6A, respectively.
Figure 7B:
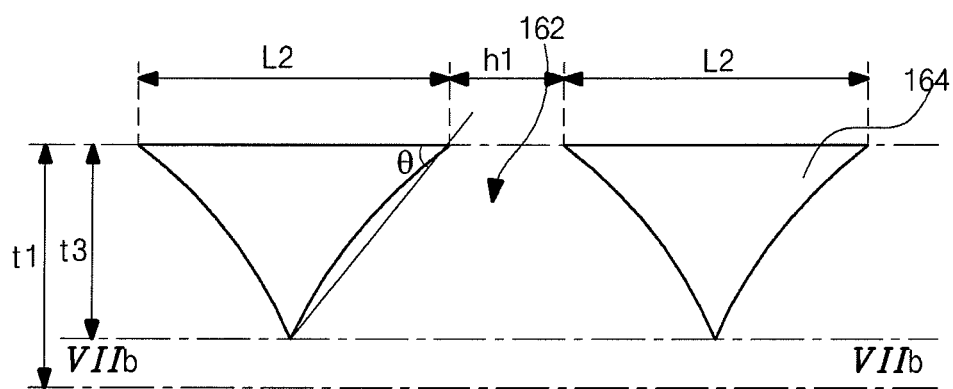

FIGS. 7A and 7B are cross-sectional views taken along the lines VIIa-VIIa and VIIb-VIIb in FIG. 6A, respectively. As shown in FIGS. 7A and 7B, when the first shadow mask 160 including the first opening portions 162 and the first blocking portion 164 is formed by etching a metal plate (not shown), which has a first thickness "t1", the first length "L1", which is a horizontal distance between adjacent first opening portions 162, may be larger than the second length "L2" which is a vertical distance between adjacent first opening portions 162. In addition, the first width "w1" of the first opening portion 162 may be larger than the first height "h1" of the first opening portion 162. For example, the first length "L1", the second length "L2", the first width "w1" and the first height "h1" may be about 38 micrometers, about 46.5 micrometers, about 49 micrometers and about 41.5 micrometers, respectively.

When the first opening portions 162 are formed, a taper angel "θ" should be maintained as about 59 degrees to obtain a desired emitting layers. Since the width and height of the first opening portion 162 are different and the horizontal distance and the vertical distance between the adjacent first opening portions 162 are different, the thickness of the blocking portion 164 is also different along the horizontal direction and the vertical direction.

Namely, the first width "w1" of the first opening 162 is larger than the first height "h1" of the first opening 162 such that the metal plate is more etched with respect to the horizontal direction. As a result, the blocking portion 164 has a second thickness "t2" along the horizontal direction and a third thickness "t3" along the vertical direction. The second thickness "t2" is smaller than the first thickness "t1" of the metal plate, and the third thickness "t3" is larger than the second thickness "t2". For example, the second and third thicknesses "t2" and "t3" may be about 31.2 micrometers and about 38.2 micrometers, respectively.

When the first shadow mask 160 is used for forming the emitting layers, the first shadow mask 160 is fixed by a frame. To fix the first shadow mask 160 to the frame, the first shadow mask 160 should be stretched.

To prevent deformation of the first shadow mask 160 when the first shadow mask 160 is stretched, the first shadow mask 160 should have a thickness of about 40 micrometers. However, a thickness of the above first shadow mask 160 is smaller than 40 micrometers, there may be deformation in the first shadow mask 160 when the first shadow mask 160 is stretched. In addition, the first shadow mask 160 has a difference in a thickness along the horizontal direction and the vertical direction, there is a difference in expansion such that deformation of the first shadow mask 160 is further serious. The deformation of the first shadow mask 160 causes a size difference of the first opening portions 162 such that there are problems in the emitting layers 132 and 134.

To prevent the deformation of the shadow mask, the red and green sub-pixel regions are alternately arranged. This arrangement of the sub-pixel regions is illustrated with reference to following drawings.

Figure 8:
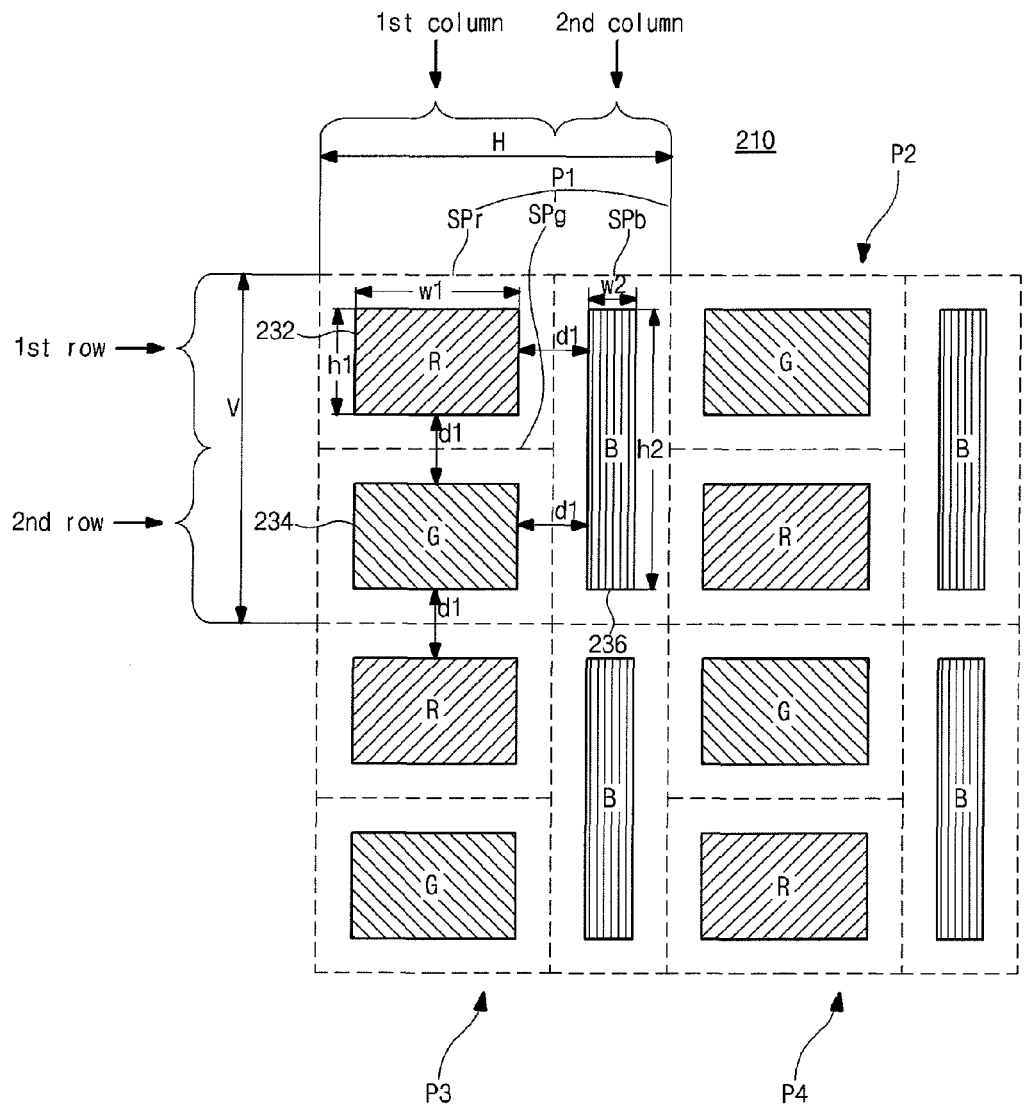
FIG. 8 is a schematic view showing pixel regions of an OELD device according to a second embodiment of the present invention.

FIG. 8 is a schematic view showing pixel regions of an OELD device according to a second embodiment of the present invention. As shown in FIG. 8, an OELD device 210 includes first to fourth pixel regions "P1" to "P4" arranged in a matrix shape. Each of the first to fourth pixel regions "P1" to "P4" includes red, green and blue sub-pixel regions "SPr", "SPg" and "SPb".

Each of the first to fourth pixel regions "P1" to "P4" has a rectangular shape to have a horizontal length "H" and a vertical length "V". The red and green sub-pixel regions "SPr" and "SPg" are alternately arranged with each other in a first column of each of the first to fourth pixel regions "P1" to "P4", and the blue sub-pixel region "SPb" is arranged in a second column of each of the first to fourth pixel regions "P1" to "P4".

Each of the first to fourth pixel regions "P1" to "P4" is divided into the first and second columns along a horizontal direction, and the first column is divided into first and second rows along a vertical direction. The red sub-pixel region "SPr" and the green sub-pixel region "SPg" are alternately arranged in the first and second rows of the first column. Namely, the red and green sub-pixel regions "SPr" and "SPg" are alternately arranged with each other in the pixel regions adjacent along the vertical direction. In other words, the red and green sub-pixel regions "SPr" and "SPg" are alternately arranged in the first column of the first and third pixel regions "P1" and "P3". In addition, the red and green sub-pixel regions "SPr" and "SPg" are alternately arranged with each other in the first column of the second and fourth pixel regions "P2" and "P4". As a result, in the first column, one green sub-pixel region "SPg" is positioned between two adjacent red sub-pixel regions "SPr".

For example, when the red and green sub-pixel regions "SPr" and "SPg" are respectively disposed in the first and second rows of the first column in the first pixel region "P1", the green and red sub-pixel regions "SPg" and "SPr" are respectively disposed in the first and second rows of the first column in the third pixel region "P3" which is adjacent to the first pixel region "P1" along the vertical direction.

In addition, the red and green sub-pixel regions "SPr" and "SPg" are alternately arranged with each other in the pixel regions adjacent along the horizontal direction. For example, when the red and green sub-pixel regions "SPr" and "SPg" are respectively disposed in the first and second rows of the first column in the first pixel region "P1", the green and red sub-pixel regions "SPg" and "SPr" are respectively disposed in the first and second rows of the first column in the second pixel region "P2" which is adjacent to the first pixel region "P1" along the horizontal direction.

With the above sub-pixel region arrangement, a distance between adjacent red sub-pixel regions "SPr" and between adjacent green sub-pixel regions "SPg" is increased such that a fabrication of the shadow mask becomes easy.

The blue sub-pixel region "SPb" is positioned in the second column. Red, green and blue emitting layers 232, 234 and 236 are respectively formed in the red, green and blue sub-pixel regions "SPr", "SPg" and "SPb". The red, green and blue emitting layers 232, 234 and 236 constitute an emitting diode (not shown) with a first electrode (not shown) and a second electrode (not shown). To prevent the shadowing problem, the emitting layers 232, 234 and 236 are spaced apart from each other by a first distance "d1". For example, the first distance "d1" may be about 22 micrometers.

Each of the red and green emitting layers 232 and 234 has a first width "w1", i.e., a horizontal length, and a first height "h1", i.e., a vertical length. The blue emitting layer 236 has a second width "w2" and a second height "h2". Namely, each of the red, green and blue emitting layers 232, 234 and 236 has a rectangular shape. The red and green sub-pixel regions "SPr" and "SPg" are positioned in the first column of each of the pixel regions "P1" to "P4" such that the first width "w1" is larger than the first height "h1". On the contrary, the blue sub-pixel region "SPb" is positioned in an entire of the second column such that the second width "w2" is smaller than the second height "h2".

The red, green and blue emitting layers 232, 234 and 236 are formed by a thermal deposition using a shadow mask. In FIG. 8, the red, green and blue emitting layers 232, 234 and 236 are overlapped portions of the first and second electrodes.

As mentioned above, in the OELD device 210 according to the second embodiment of the present invention, the first and second columns are defined by dividing each of the first to fourth pixel regions "P1" to "P4", and the first and second rows are defined by dividing the first column. The red and green sub-pixel regions "SPr" and "SPg" are alternately arranged in the first column. The red and green sub-pixel regions "SPr" and "SPg" are alternately arranged with each other along the vertical direction and the horizontal direction. The red, green and blue emitting layers 232, 234 and 236 are respectively formed in the red, green and blue sub-pixel regions "SPr", "SPg" and "SPb".

Accordingly, with compared to the related art OELD device, where three sub-pixel regions are arranged along a direction, there is a margin in reduction of the width of the sub-pixel regions. As a result, there is a margin for requirement of a high resolution. Namely, when an area, e.g., a width, of the red, green and blue sub-pixel regions "SPr", "SPg" and "SPb" is reduced with requirement of a high resolution, there is a margin in reduction of the width of the red, green and blue sub-pixel regions "SPr", "SPg" and "SPb" such that a shadow mask for forming the red, green and blue emitting layers 232, 234 and 236 is easily fabricated.

In addition, a distance between adjacent red sub-pixel regions "SPr" and between adjacent green sub-pixel regions "SPg" is increased, the shadow mask for the red and green sub-pixel regions "SPr" and "SPg" is further easily fabricated.

Figure 9:
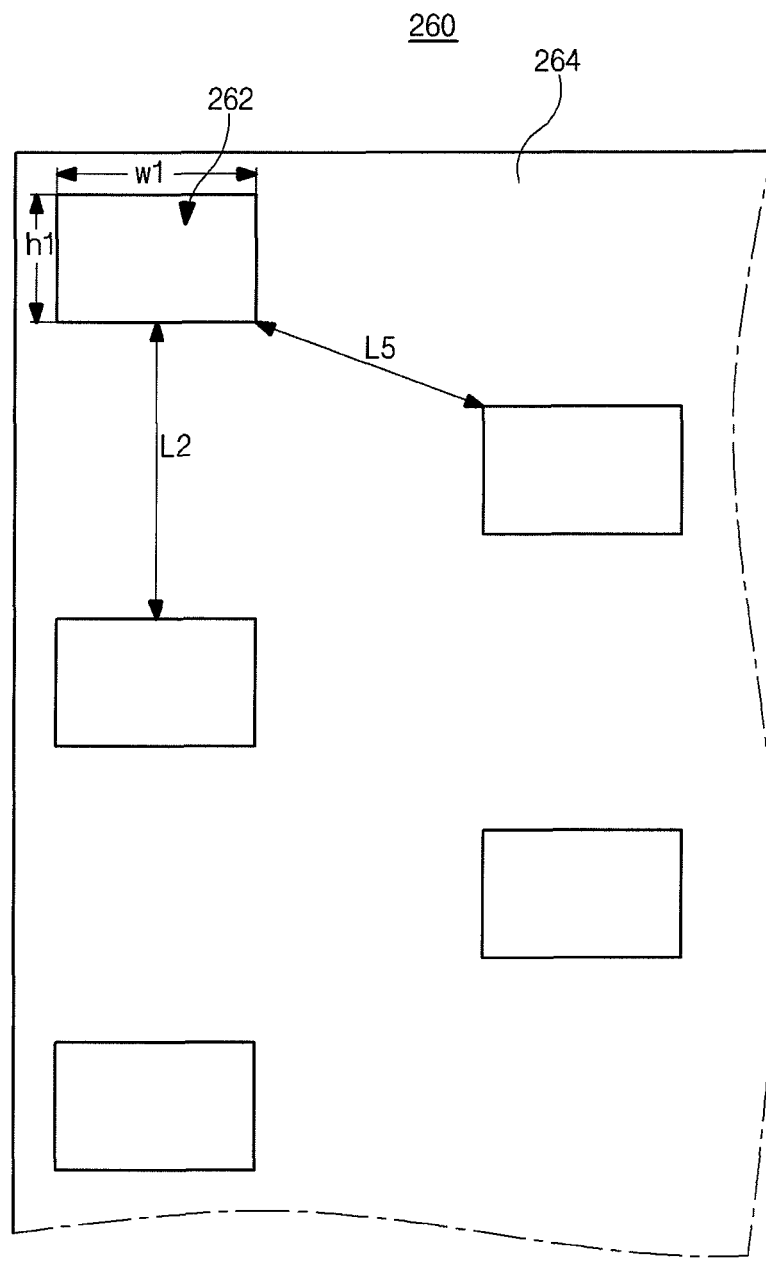
FIG. 9 is a view showing a shadow mask used for red and green emitting layers of an OELD device according to the second embodiment of the present invention.

FIG. 9 is a view showing a shadow mask used for red and green emitting layers of an OELD device according to the second embodiment of the present invention. The shadow mask used for red and green emitting layers is illustrated with FIGS. 8 and 9. The shadow mask used for the blue emitting layer is same as that in the first embodiment.

As shown in FIG. 9, the shadow mask 260 used for forming the red and green sub-pixel regions 232 and 234 includes a plurality of opening portions 262 for transmitting an emitting material and a blocking portion 264. An align position of the shadow mask 260 for the red emitting layer 232 is different from an align position of the shadow mask 260 for the green emitting layer 234. The shadow mask 260 is moved along a vertical direction or a horizontal direction to form one of the red and green emitting layers 232 and 234 after forming the other of the red and green emitting layers 232 and 234.

Each of the opening portions 262 corresponds to the red emitting layer 232 or the green emitting layer 234 in each of the pixel region "P1" to "P4". Each of the opening portions 262 has a size substantially equal to the first width "w1" and the first height "h1". Accordingly, adjacent opening regions 262 along a vertical direction are spaced apart from each other by a second length "L2" corresponding to a summation of the first height "h1" of the red emitting layer 232 or the green emitting layer 234 and twice of the first distance "d1". (L2~h1+2*d1) In addition, adjacent opening portions 262 along a diagonal direction are spaced apart from each other by a fifth length "L5" which is calculated by a summation of the second width "w2" of the blue emitting layer 236 and twice of the first distance "d1" and the first distance "d1". (L5~((w2+2*d1)$^2$+d1$^2$)$^{1/2}$ Alternatively, each of the first opening portions 162 has a size larger the first width "w1" and the first height "h1".

The fifth length "L5" is larger than the first length "L1", which is a horizontal distance between adjacent first opening portions 162 in the first embodiment, and closer to the second length "L2" than the first length "L1".

Namely, a distance between adjacent opening portions 262 is increased, the shadow mask 260 is easily fabricated with a higher resolution. In addition, since the distances between adjacent opening portions 262 along the vertical direction and the diagonal direction become close, a thickness difference of the blocking portion 264 of the shadow mask 260 is reduced such that deformation of the shadow mask 260 is prevented.

Figure 10:
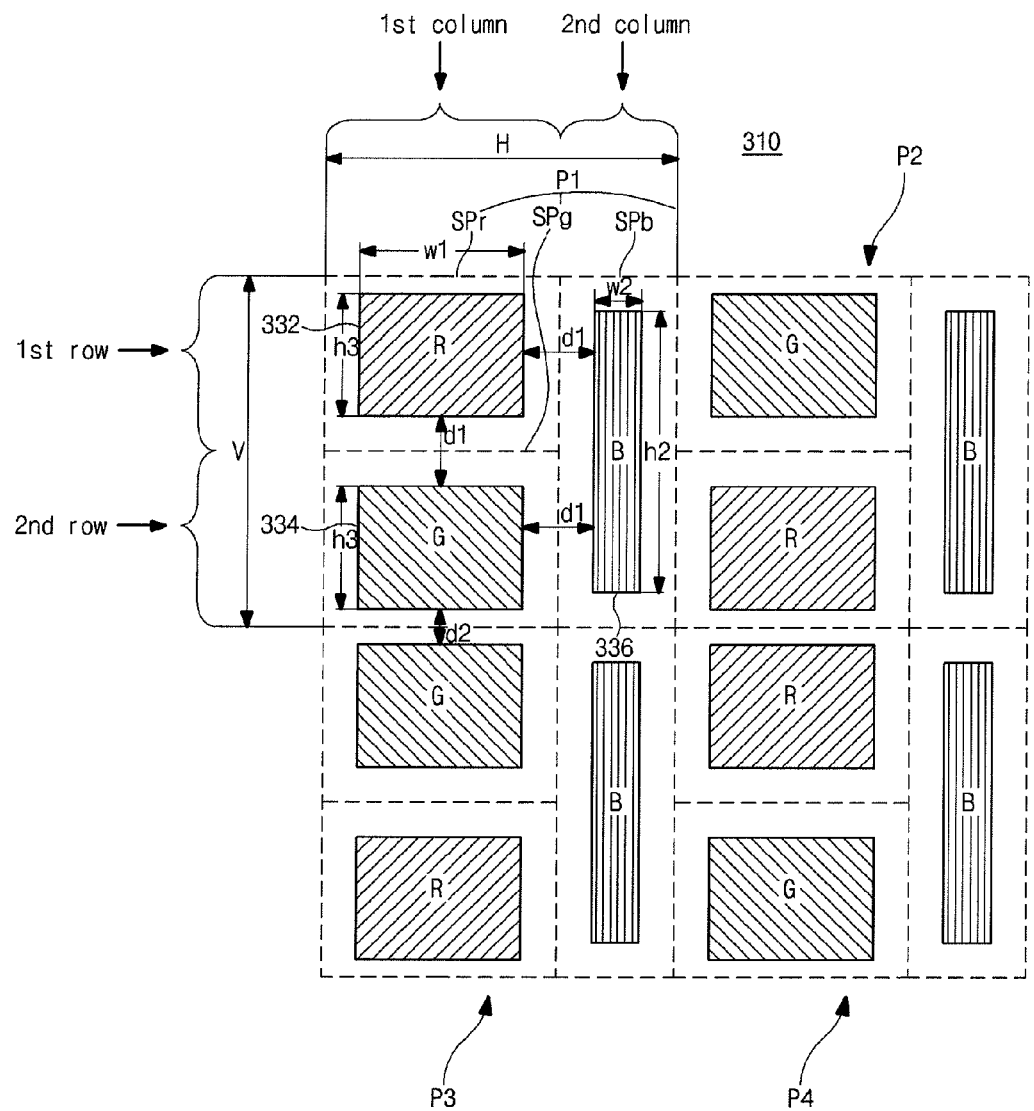
FIG. 10 is a schematic view showing pixel regions of an OELD device according to a third embodiment of the present invention.

FIG. 10 is a schematic view showing pixel regions of an OELD device according to a third embodiment of the present invention. As shown in FIG. 10, an OELD device 310 includes first to fourth pixel regions "P1" to "P4" arranged in a matrix shape. Each of the first to fourth pixel regions "P1" to "P4" includes red, green and blue sub-pixel regions "SPr", "SPg" and "SPb".

Each of the first to fourth pixel regions "P1" to "P4" has a rectangular shape to have a horizontal length "H" and a vertical length "V". The red and green sub-pixel regions "SPr" and "SPg" are alternately arranged with each other in a first column of each of the first to fourth pixel regions "P1" to "P4", and the blue sub-pixel region "SPb" is arranged in a second column of each of the first to fourth pixel regions "P1" to "P4".

Each of the first to fourth pixel regions "P1" to "P4" is divided into the first and second columns along a horizontal direction, and the first column is divided into first and second rows along a vertical direction. The red sub-pixel region "SPr" and the green sub-pixel region "SPg" are alternately arranged in the first and second rows of the first column. Namely, the red and green sub-pixel regions "SPr" and "SPg" are alternately arranged with each other in the pixel regions adjacent along the vertical direction. In other words, the red and green sub-pixel regions "SPr" and "SPg" are alternately arranged in the first column of the first and third pixel regions "P1" and "P3". In addition, the red and green sub-pixel regions "SPr" and "SPg" are alternately arranged with each other in the first column of the second and fourth pixel regions "P2" and "P4". As a result, in the first column, one green sub-pixel region "SPg" is positioned between two adjacent red sub-pixel regions "SPr".

In the vertically-arranged pixel regions "P1" and "P3" or "P2" and "P4", the same color sub-pixel regions are arranged to be closer than different color sub-pixel regions. For example, when the red and green sub-pixel regions "SPr" and "SPg" are respectively disposed in the first and second rows of the first column in the first pixel region "P1", the green and red sub-pixel regions "SPg" and "SPr" are respectively disposed in the first and second rows of the first column in the third pixel region "P3". In this case, a distance between the red and green sub-pixel regions "SPr" and "SPg" in each of the first and third pixel regions "P1" and "P3" is larger than that between the green sub-pixel region "SPg" in the first pixel region "P1" and the green sub-pixel region "SPg" in the second pixel region "P2".

In addition, the red and green sub-pixel regions "SPr" and "SPg" are alternately arranged with each other in the pixel regions adjacent along the horizontal direction. For example, when the red and green sub-pixel regions "SPr" and "SPg" are respectively disposed in the first and second rows of the first column in the first pixel region "P1", the green and red sub-pixel regions "SPg" and "SPr" are respectively disposed in the first and second rows of the first column in the second pixel region "P2" which is adjacent to the first pixel region "P1" along the horizontal direction.

Similarly, the red and green sub-pixel regions "SPr" and "SPg" are respectively arranged in the first and second rows of the first column in the fourth pixel region "P4". In this case, a distance between the red and green sub-pixel regions "SPr" and "SPg" in each of the second and fourth pixel regions "P2" and "P4" is larger than that between the red sub-pixel region "SPr" in the second pixel region "P2" and the red sub-pixel region "SPr" in the fourth pixel region "P4".

The same color sub-pixel regions are closely arranged and closely arranged sub-pixel regions corresponds to one opening portion of the shadow mask such that a size of each opening portion of the shadow mask and a distance between opening portions of the shadow mask is increased. As a result, a fabrication of the shadow mask becomes further easy.

In addition, by alternately arranging the red and green sub-pixel regions "SPr" and "SPg" along the horizontal direction, a distance between adjacent red sub-pixel regions "SPr" and between adjacent green sub-pixel regions "SPg" is increased such that a fabrication of the shadow mask becomes easy.

The blue sub-pixel region "SPb" is positioned in the second column. Red, green and blue emitting layers 332, 334 and 336 are respectively formed in the red, green and blue sub-pixel regions "SPr", "SPg" and "SPb". The red, green and blue emitting layers 332, 334 and 336 constitute an emitting diode (not shown) with a first electrode (not shown) and a second electrode (not shown). To prevent the shadowing problem, the emitting layers 332, 334 and 336 are spaced apart from each other by a first distance "d1".

Since there is no shadowing problem in the same color emitting layers, the same color emitting layers are spaced apart from each other by a second distance "d2" being smaller than the first distance "d1". For example, the first distance "d1" may be about 22 micrometers, and the second distance "d2" may be about 13 micrometers.

For example, when the red and green sub-pixel regions "SPr" and "SPg" are respectively disposed in the first and second rows of the first column in the first pixel region "P1" and the green and blue sub-pixel regions "SPg" and "SPr" are respectively disposed in the first and second rows of the first column in the third pixel region "P3", the red and green emitting layers 332 and 334 in the first pixel region "P1" and the green and red emitting layers 334 and 332 in the third pixel region "P3" are spaced apart from each other by the first distance "d1", respectively, and the green emitting layer 334 in the first pixel region "P1" and the green emitting layer 334 in the third pixel region "P3" are spaced apart from each other by the second distance "d2" being smaller than the first distance "d1".

Accordingly, with the same size pixel region, a size of each of the red and green emitting layers 332 and 334 in the third embodiment is larger than a size of each of the red and green emitting layers 232 and 234 in the second embodiment.

Namely, each of the red and green emitting layers 332 and 334 has a first width "w1", which is equal to the first width "w1" in the second embodiment, and a third height "h3", which is larger than the first height "h1" in the second embodiment. The blue emitting layer 336 has the second width "w2" and the second height "h2" being larger than the second width "w2".

In FIG. 10, the first width "w1" is larger than the third height "h3". Alternatively, when the third height "h3" is further increased, the third height "h3" may be larger than the first width "w1".

The red, green and blue emitting layers 332, 334 and 336 are formed by a thermal deposition using a shadow mask. In FIG. 10, the red, green and blue emitting layers 332, 334 and 336 are overlapped portions of the first and second electrodes.

As mentioned above, in the OELD device 310 according to the third embodiment of the present invention, the first and second columns are defined by dividing each of the first to fourth pixel regions "P1" to "P4", and the first and second rows are defined by dividing the first column. The red and green sub-pixel regions "SPr" and "SPg" are alternately arranged in the first column. The red and green sub-pixel regions "SPr" and "SPg" are alternately arranged with each other along the vertical direction and the horizontal direction. In the first column of vertically adjacent pixel regions "P1" and "P3" or "P2" and "P4", the same color sub-pixel regions are arranged to be closer than different color sub-pixel regions. The red, green and blue emitting layers 332, 334 and 336 are respectively formed in the red, green and blue sub-pixel regions "SPr", "SPg" and "SPb".

Accordingly, with compared to the related art OELD device, where three sub-pixel regions are arranged along a direction, there is a margin in reduction of the width of the sub-pixel regions. As a result, there is a margin for requirement of a high resolution. Namely; when an area, e.g., a width and a height, of the red, green and blue sub-pixel regions "SPr", "SPg" and "SPb" is reduced with requirement of a high resolution, there is a margin in reduction of the area of the red, green and blue sub-pixel regions "SPr", "SPg" and "SPb" such that a shadow mask for forming the red, green and blue emitting layers 332, 334 and 336 is easily fabricated.

In addition, the same color sub-pixel regions are closely arranged and closely arranged sub-pixel regions corresponds to one opening portion of the shadow mask such that a size of each opening portion of the shadow mask and a distance between opening portions of the shadow mask is increased. Moreover, by alternately arranging the red and green sub-pixel regions "SPr" and "SPg" along the horizontal direction, a distance between adjacent red sub-pixel regions "SPr" and between adjacent green sub-pixel regions "SPg" is increased. As a result, a fabrication of the shadow mask used for the red and green emitting layers 342 and 344 becomes easy.

Figure 11:
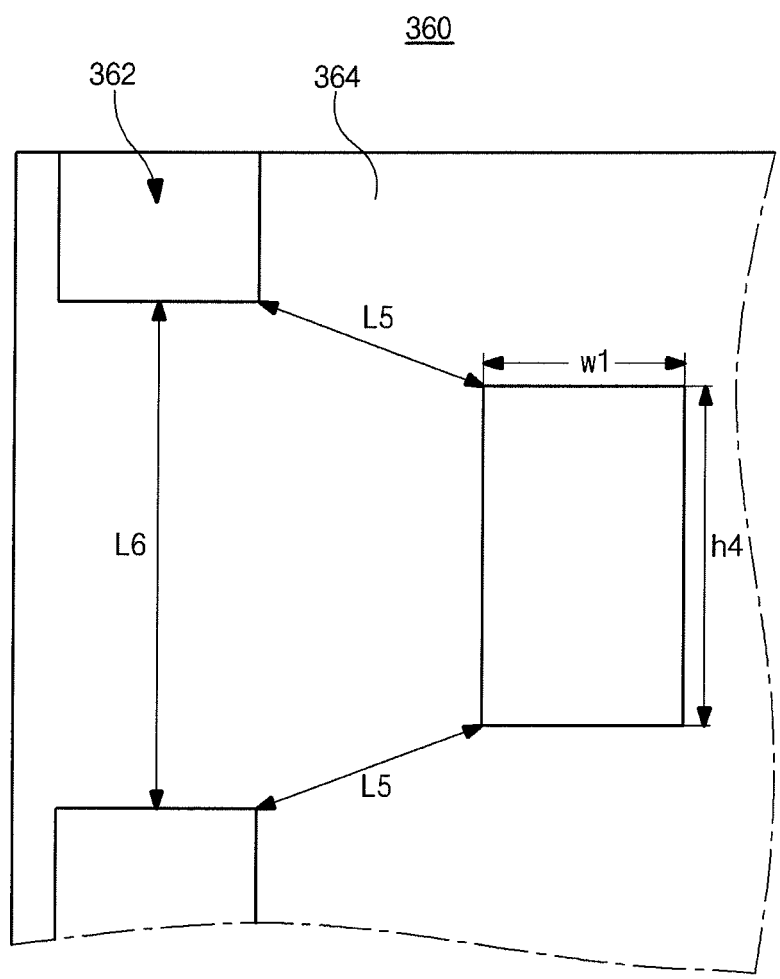
FIG. 11 is a view showing a shadow mask used for red and green emitting layers of an OELD device according to the third embodiment of the present invention.

In the OEDL device 310 according to the third embodiment of the present invention, the red and green emitting layers 332 and 334 are formed using the above shadow mask. FIG. 11 is a view showing a shadow mask used for red and green emitting layers of an OELD device according to the third embodiment of the present invention. The shadow mask used for the blue emitting layer is same as that in the first and second embodiments.

Referring to FIG. 11 with FIG. 10, the shadow mask 360 used for forming the red and green emitting layers 332 and 334 includes a plurality of opening portions 362 for transmitting an emitting material and a blocking portion 364. An align position of the shadow mask 360 for the red emitting layer 332 is different from an align position of the shadow mask 360 for the green emitting layer 334. The shadow mask 360 is moved along a vertical direction or a horizontal direction to form one of the red and green emitting layers 332 and 334 after forming the other of the red and green emitting layers 332 and 334.

Each of the opening portions 362 corresponds to two adjacent red emitting layers 332 or two adjacent green emitting layers 334 in vertically adjacent pixel regions. Each of the opening portions 362 has the first width "w1" and a fourth height "h4". The fourth height "h4" is equal to a summation of twice of the third height "h3" of the red emitting layer 332 or the green emitting layer 334 and the second distance "d2". (h4~2*h3+d2) Alternatively, the fourth height "h4" may be larger than a summation of heights of two adjacent red emitting layers 332 and a distance between two adjacent red emitting layers 332.

The adjacent opening portions 362 in the shadow mask 360 is space apart from each other along a diagonal direction by a fifth length "L5" which is calculated by a summation of the second width "w2" of the blue emitting layer 336 and twice of the first distance "d1" and the first distance "d1". (L5~((w2+

$2*d1)^2+d1^2)^{1/2}$ In addition, the adjacent opening portions 362 in the shadow mask 360 is space apart from each other along a vertical direction by a sixth length "L6" corresponding to a summation of twice of the third height "h3" of the red emitting layer 332 or the green emitting layer 334, twice of the first distance "d1" and the second distance "d2". (L6~2*h3+ 2*d1+d2)

The fourth height "h4" of each opening portion 362 is larger than the first height "h1" of each of the opening portions 162 and 262 in the first and second embodiments, and the sixth length "L6", which is a diagonal distance between adjacent opening portions 362, is larger than the second length "L2", which is a distance between vertically adjacent opening portions 162 and 262, in the first and second embodiments.

Namely, a distance between adjacent opening portions 362 and a size of the opening portion 362 are increased, the shadow mask 360 is easily fabricated with a higher resolution. In addition, since the distances between adjacent opening portions 362 along the vertical direction and the diagonal direction become close, a thickness difference of the blocking portion 364 of the shadow mask 360 is reduced such that deformation of the shadow mask 360 is prevented.

Figure 12:
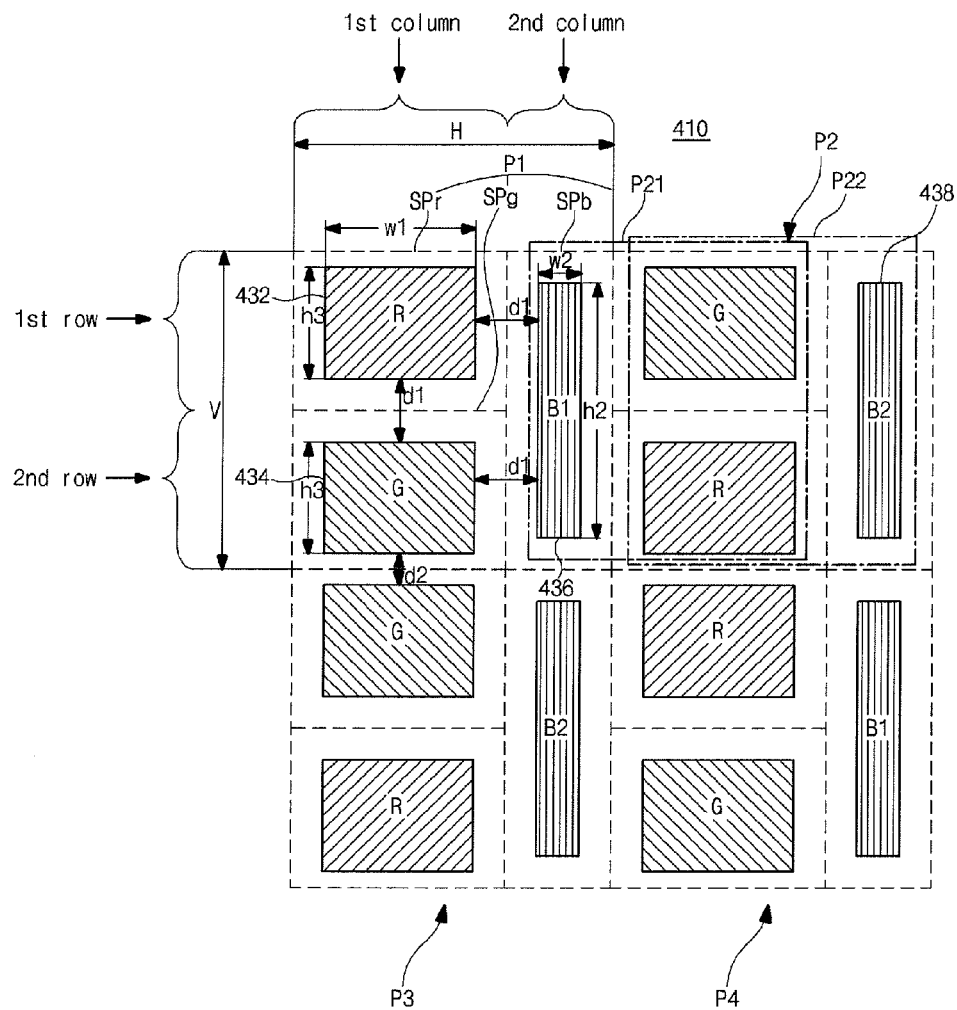
FIG. 12 is a schematic view showing pixel regions of an OELD device according to a fourth embodiment of the present invention.

FIG. 12 is a schematic view showing pixel regions of an OELD device according to a fourth embodiment of the present invention. The OELD device in FIG. 12 includes two blue sub-pixel regions to further increase a distance between the opening portions of the shadow mask.

As shown in FIG. 12, an OELD device 410 includes first to fourth pixel regions "P1" to "P4" arranged in a matrix shape. Each of the first to fourth pixel regions "P1" to "P4" includes red, green and deep blue sub-pixel regions "SPr", "SPg" and "SPb1" or red, green and sky blue sub-pixel regions "SPr", "SPg" and "SPb2".

Each of the first to fourth pixel regions "P1" to "P4" has a rectangular shape to have a horizontal length "H" and a vertical length "V". The red and green sub-pixel regions "SPr" and "SPg" are alternately arranged with each other in a first column of each of the first to fourth pixel regions "P1" to "P4". In the vertically adjacent pixel regions, the same color sub-pixel regions are closely arranged. The deep blue sub-pixel region "SPb1" is arranged in a second column of one pixel region, and the sky blue sub-pixel region "SPb2" is arranged in a second column of another one pixel region. The deep blue sub-pixel region "SPb1" and the sky blue sub-pixel region "SPb2" are alternately arranged with each other along the vertical direction and the horizontal direction.

Each of the first to fourth pixel regions "P1" to "P4" is divided into the first and second columns along a horizontal direction, and the first column is divided into first and second rows along a vertical direction. The red sub-pixel region "SPr" and the green sub-pixel region "SPg" are alternately arranged in the first and second rows of the first column. Namely, the red and green sub-pixel regions "SPr" and "SPg" are alternately arranged with each other in the pixel regions adjacent along the vertical direction. In other words, the red and green sub-pixel regions "SPr" and "SPg" are alternately arranged in the first column of the first and third pixel regions "P1" and "P3". In addition, the red and green sub-pixel regions "SPr" and "SPg" are alternately arranged with each other in the first column of the second and fourth pixel regions "P2" and "P4". As a result, in the first column, one green sub-pixel region "SPg" is positioned between two adjacent red sub-pixel regions "SPr".

In the vertically-arranged pixel regions "P1" and "P3" or "P2" and "P4", the same color sub-pixel regions are arranged to be closer than different color sub-pixel regions. For example, when the red and green sub-pixel regions "SPr" and "SPg" are respectively disposed in the first and second rows of the first column in the first pixel region "P1", the green and red sub-pixel regions "SPg" and "SPr" are respectively disposed in the first and second rows of the first column in the third pixel region "P3". In this case, a distance between the red and green sub-pixel regions "SPr" and "SPg" in each of the first and third pixel regions "P1" and "P3" is larger than that between the green sub-pixel region "SPg" in the first pixel region "P1" and the green sub-pixel region "SPg" in the second pixel region "P2".

In addition, the red and green sub-pixel regions "SPr" and "SPg" are alternately arranged with each other in the pixel regions adjacent along the horizontal direction. For example, when the red and green sub-pixel regions "SPr" and "SPg" are respectively disposed in the first and second rows of the first column in the first pixel region "P1", the green and red sub-pixel regions "SPg" and "SPr" are respectively disposed in the first and second rows of the first column in the second pixel region "P2" which is adjacent to the first pixel region "P1" along the horizontal direction.

Similarly, the red and green sub-pixel regions "SPr" and "SPg" are respectively arranged in the first and second rows of the first column in the fourth pixel region "P4". In this case, a distance between the red and green sub-pixel regions "SPr" and "SPg" in each of the second and fourth pixel regions "P2" and "P4" is larger than that between the red sub-pixel region "SPr" in the second pixel region "P2" and the red sub-pixel region "SPr" in the fourth pixel region "P4".

The same color sub-pixel regions are closely arranged and closely arranged sub-pixel regions corresponds to one opening portion of the shadow mask such that a size of each opening portion of the shadow mask and a distance between opening portions of the shadow mask is increased. As a result, a fabrication of the shadow mask becomes further easy.

In addition, by alternately arranging the red and green sub-pixel regions "SPr" and "SPg" along the horizontal direction, a distance between adjacent red sub-pixel regions "SPr" and between adjacent green sub-pixel regions "SPg" is increased such that a fabrication of the shadow mask becomes easy.

The deep blue sub-pixel region "SPb1", the sky blue sub-pixel region "SPb2", the deep blue sub-pixel region "SPb1" and the sky blue sub-pixel region "SPb2" are respectively disposed in the second columns of the first to fourth pixel regions "P1" to "P4". Since deep blue emitting layer 436 in the deep blue sub-pixel region "SPb1" and sky blue emitting layer 438 in the sky blue sub-pixel region "SPb2" are formed of different material, they can not be formed in one time. A shadow mask for the deep blue and sky blue emitting layers 436 and 438 is illustrated below.

The red, green, deep blue and sky blue emitting layers 432, 434, 436 and 438 are respectively formed in the red sub-pixel region "SPr", the green sub-pixel region "SPg", the deep blue sub-pixel region "SPb1" and the sky blue sub-pixel region "SPb2". The red, green, deep blue and sky blue emitting layers 432, 434, 436 and 438 constitute an emitting diode (not shown) with a first electrode (not shown) and a second electrode (not shown). To prevent the shadowing problem, the emitting layers 432, 434, 436 and 438 are spaced apart from each other by a first distance "d1". Since there is no shadowing problem in the same color emitting layers, the same color emitting layers are spaced apart from each other by a second distance "d2" being smaller than the first distance "d1".

For example, when the red and green sub-pixel regions "SPr" and "SPg" are respectively disposed in the first and second rows of the first column in the first pixel region "P1"

and the green and red sub-pixel regions "SPg" and "SPr" are respectively disposed in the first and second rows of the first column in the third pixel region "P3", the red and green emitting layers 432 and 334 in the first pixel region "P1" and the green and red emitting layers 434 and 432 in the third pixel region "P3" are spaced apart from each other by the first distance "d1", respectively, and the green emitting layer 434 in the first pixel region and the green emitting layer 434 in the third pixel region "P3" are spaced apart from each other by the second distance "d2" being smaller than the first distance "d1".

Accordingly, with the same size pixel region, a size of each of the red and green emitting layers 432 and 434 in the third embodiment is larger than a size of each of the red and green emitting layers 232 and 234 in the second embodiment.

Namely, each of the red and green emitting layers 432 and 434 has a first width "w1", which is equal to the first width "w1" in the second embodiment, and a third height "h3", which is larger than the first height "h1" in the second embodiment. Each of the deep blue emitting layer 436 and the sky blue emitting layer 438 has the second width "w2" and the second height "h2" being larger than the second width "w2".

In FIG. 12, the first width "w1" is larger than the third height "h3". Alternatively, when the third height "h3" is further increased, the third height "h3" may be larger than the first width "w1".

The red, green, deep blue and sky blue emitting layers 432, 434, 436 and 438 are formed by a thermal deposition using a shadow mask. In FIG. 12, the red, green, deep blue and sky blue emitting layers 432, 434, 436 and 438 are overlapped portions of the first and second electrodes.

The deep blue emitting layer 436 and the sky blue emitting layer 438 have an advantage and a disadvantage depending on properties of the emitting material. The deep blue emitting layer 436 has an advantage in a color reproductivity, while the sky blue emitting layer 438 has an advantage in a life time and an emission efficiency.

In the OELD device 410, the deep blue and sky blue emitting layers 436 and 438 are alternately arranged with each other to obtain advantages of the deep blue and sky blue emitting layers 436 and 438.

Namely, when the high color reproduction image is displayed, the deep blue emitting layer 436 except the sky blue emitting layer 438 is driven. In this case, the red and green emitting layers 432 and 434 in the second pixel region "P2" constitute one unit pixel "P21" with the deep blue emitting layer 436 in the first pixel region "P1". Namely, the red and green sub-pixel regions "SPr" and "SPg" in the first pixel region "P1" and the red and green sub-pixel regions "SPr" and "SPg" in the second pixel region "P2" share the deep blue sub-pixel region "SPb1".

On the other hand, when a general image is displayed without the high color reproduction, the sky blue emitting layer 438 except the deep blue emitting layer 436 is driven. In this case, the red and green emitting layers 432 and 434 in the second pixel region "P2" constitute one unit pixel "P22" with the sky blue emitting layer 438 in the second pixel region "P2". Namely, the red and green sub-pixel regions "SPr" and "SPg" in the first pixel region "P1" and the red and green sub-pixel regions "SPr" and "SPg" in the second pixel region "P2" share the sky blue sub-pixel region "SPb2".

As mentioned above, the deep blue emitting layer 436 and the sky blue emitting layer 438 are selectively driven depending on the displayed image. In this case, by using a rendering method, the unit pixel as a unit for displaying an image is varied.

In the OELD device 410 according to the fourth embodiment of the present invention, the first and second columns are defined by dividing each of the first to fourth pixel regions "P1" to "P4", and the first and second rows are defined by dividing the first column. The red and green sub-pixel regions "SPr" and "SPg" are alternately arranged in the first column. The red and green sub-pixel regions "SPr" and "SPg" are alternately arranged with each other along the vertical direction and the horizontal direction. In the first column of vertically adjacent pixel regions "P1" and "P3" or "P2" and "P4", the same color sub-pixel regions are arranged to be closer than different color sub-pixel regions. The deep blue sub-pixel region "SPb1" and the sky blue sub-pixel region "SPb2" are respectively disposed in the second column of one pixel region and in the second column of another one pixel region. The red, green, deep blue and sky blue emitting layers 432, 434, 436 and 438 are respectively formed in the red, green, deep blue and sky blue sub-pixel regions "SPr", "SPg", "SPb1" and "SPb2".

Accordingly, with compared to the related art OELD device, where three sub-pixel regions are arranged along a direction, there is a margin in reduction of the width of the sub-pixel regions. As a result, there is a margin for requirement of a high resolution. Namely, when an area, e.g., a width and a height, of the red, green, deep blue and sky blue sub-pixel regions "SPr", "SPg", "SPb1" and "SPb2" is reduced with requirement of a high resolution, there is a margin in reduction of the area of the red red, green, deep blue and sky blue sub-pixel regions "SPr", "SPg", "SPb1" and "SPb2" such that a shadow mask for forming the red, green, deep blue and sky blue emitting layers 432, 434, 436 and 438 is easily fabricated.

In addition, the same color sub-pixel regions are closely arranged and closely arranged sub-pixel regions corresponds to one opening portion of the shadow mask such that a size of each opening portion of the shadow mask and a distance between opening portions of the shadow mask is increased. Moreover, by alternately arranging the red and green sub-pixel regions "SPr" and "SPg" along the horizontal direction, a distance between adjacent red sub-pixel regions "SPr" and between adjacent green sub-pixel regions "SPg" is increased. As a result, a fabrication of the shadow mask used for the red and green emitting layers 432 and 434 becomes easy.

Moreover, since the deep blue emitting layer 436 in the deep blue sub-pixel region "SPb1" and the sky blue emitting layer 438 in the sky blue sub-pixel region "SPb2" are formed in different process, a distance between the opening portions of the shadow mask for used the deep blue emitting layer 436 and the sky blue emitting layer 438 is increased such that a fabrication of the shadow mask used for the deep blue emitting layer 436 and the sky blue emitting layer 438 becomes easy.

Figure 13:
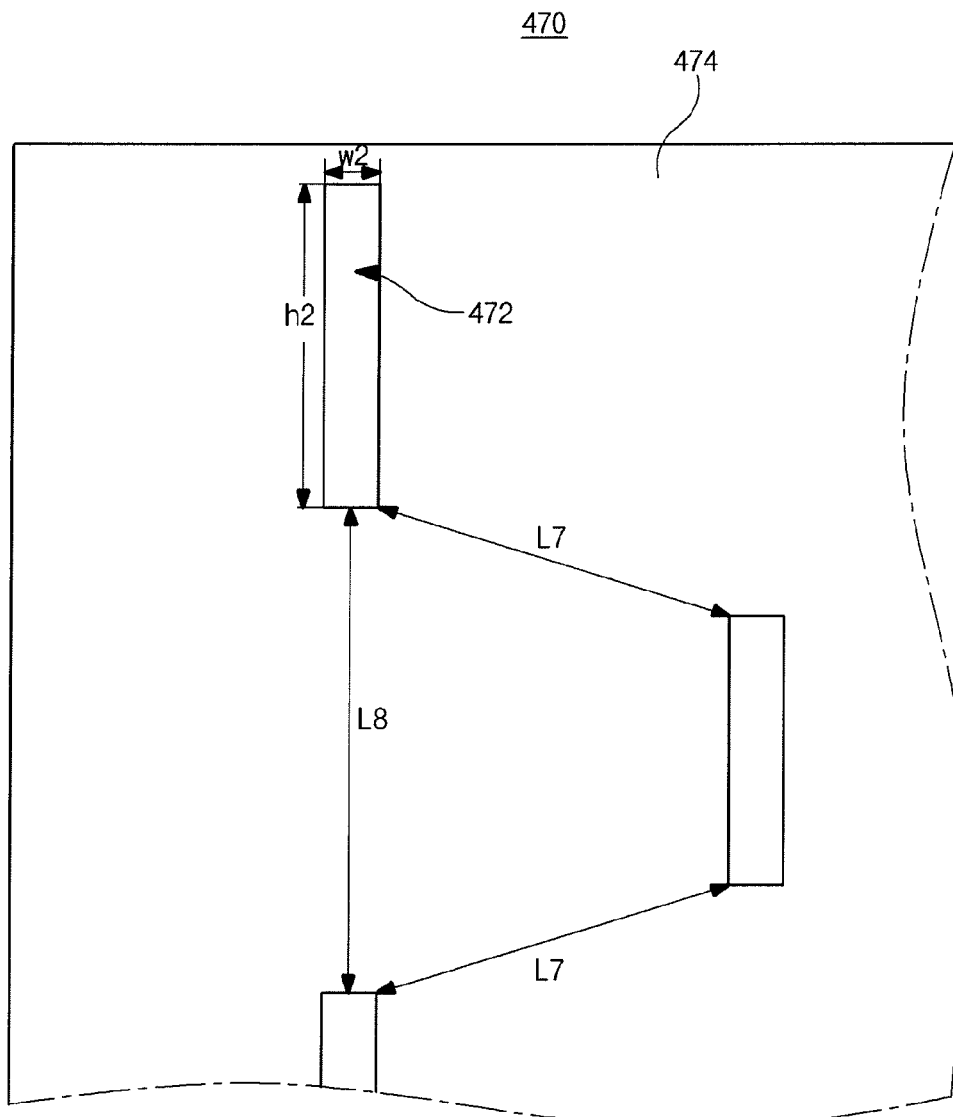
FIG. 13 is a view showing a shadow mask used for deep blue and sky blue emitting layers of an OELD device according to the fourth embodiment of the present invention.

The shadow mask used for the deep blue emitting layer 436 and the sky blue emitting layer 438 is illustrated with FIG. 13. FIG. 13 is a view showing a shadow mask used for deep blue and sky blue emitting layers of an OELD device according to the fourth embodiment of the present invention. The shadow mask used for the red and green emitting layers is same as that in the third embodiment.

Referring to FIG. 13 with FIG. 12, a shadow mask 470 used for forming the deep blue emitting layer 436 and the sky blue emitting layer 438 includes a plurality of opening portions 472 for transmitting an emitting material and a blocking portion 474. An align position of the shadow mask 470 for the deep blue emitting layer 436 is different from an align position of the shadow mask 470 for the sky blue emitting layer 438. The shadow mask 470 is moved along a vertical direction or a horizontal direction to form one of the deep blue and sky blue emitting layers 436 and 438 after forming the other of the deep blue and sky blue emitting layers 436 and 438.

Each of the opening portions 472 corresponds to the deep blue emitting layer 436 or the sky blue emitting layer 438 in the OELD device 410. Each of the opening portions 472 has a second width "w2" and a second height "h2". Namely, each of the opening portions 472 has substantially the same size as the deep blue emitting layer 436 or the sky blue emitting layer 438. Alternatively, each of the opening portions 472 may have a size larger than the deep blue emitting layer 436 or the sky blue emitting layer 438.

The adjacent opening portions 472 of the shadow mask 470 are spaced apart from each other by a seventh length "L7" along a diagonal direction. The seventh length "L7" is obtained by a summation of the first width "w1" and twice of the first distance "d1", and the first distance "d1". (L7~((w1+2*d1)$^2$+d1$^2$)$^{1/2}$ In addition, the adjacent opening portions 472 in the shadow mask 470 is space apart from each other by an eighth length "L8" along a vertical direction. The eighth length "L8" corresponds to a summation of twice of the second height "h2" of the deep blue emitting layer 436 or the sky blue emitting layer 438 and twice of the first distance "d1". (L8~h2+2*d1)

Namely, a distance between adjacent opening portions 472 is increased, the shadow mask 470 is easily fabricated with a higher resolution. In addition, since the distances between adjacent opening portions 472 along the vertical direction and the diagonal direction become close, a thickness difference of the blocking portion 474 of the shadow mask 470 is reduced such that deformation of the shadow mask 470 is prevented.

Figure 14:
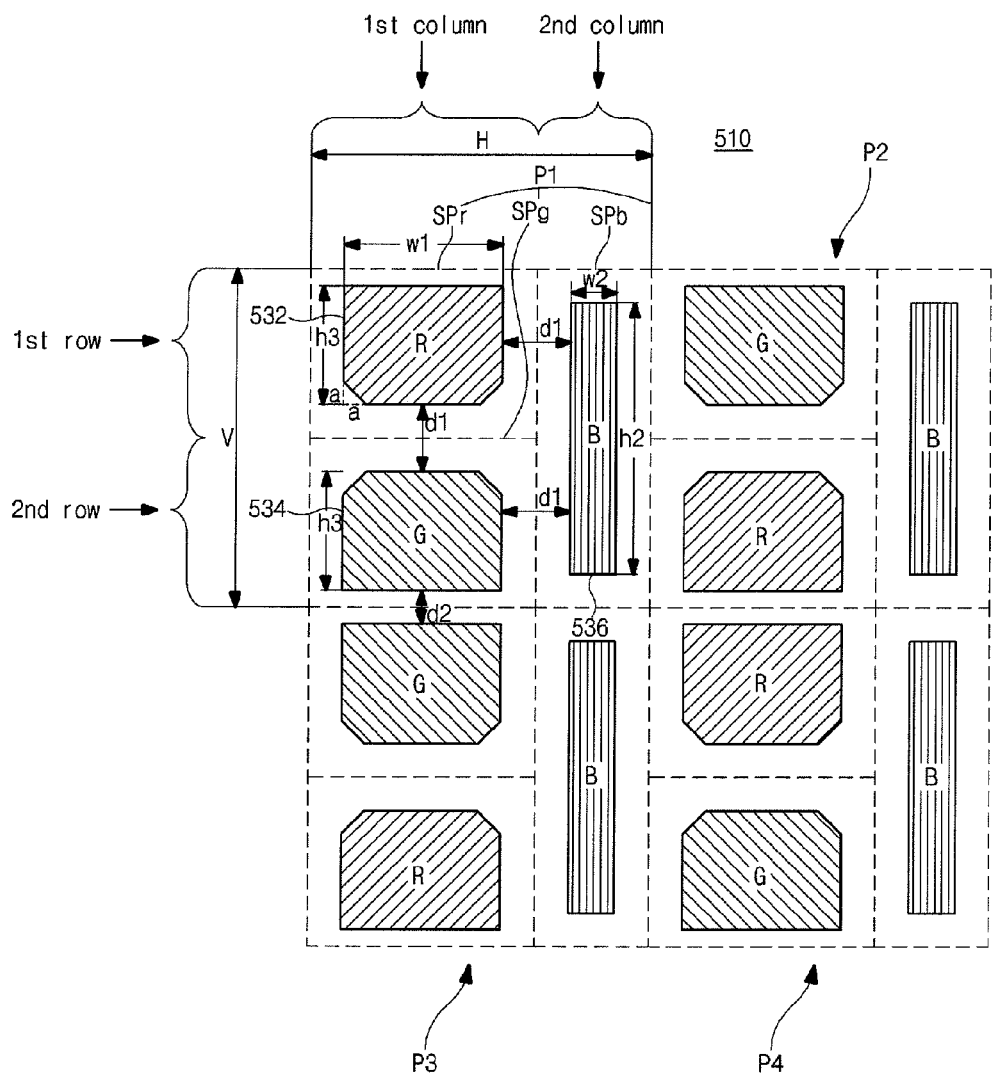
FIG. 14 is a schematic view showing pixel regions of an OELD device according to a fifth embodiment of the present invention.

To further easily fabricate the shadow mask, the distance between opening portions is further increase by removing edges of each opening. FIG. 14 is a schematic view showing pixel regions of an OELD device according to a fifth embodiment of the present invention.

As shown in FIG. 14, an OELD device 510 includes first to fourth pixel regions "P1" to "P4" arranged in a matrix shape. Each of the first to fourth pixel regions "P1" to "P4" includes red, green and blue sub-pixel regions "SPr", "SPg" and "SPb".

Each of the first to fourth pixel regions "P1" to "P4" has a rectangular shape to have a horizontal length "H" and a vertical length "V". The red and green sub-pixel regions "SPr" and "SPg" are alternately arranged with each other in a first column of each of the first to fourth pixel regions "P1" to "P4", and the blue sub-pixel region "SPb" is arranged in a second column of each of the first to fourth pixel regions "P1" to "P4".

Each of the first to fourth pixel regions "P1" to "P4" is divided into the first and second columns along a horizontal direction, and the first column is divided into first and second rows along a vertical direction. The red sub-pixel region "SPr" and the green sub-pixel region "SPg" are alternately arranged in the first and second rows of the first column. Namely, the red and green sub-pixel regions "SPr" and "SPg" are alternately arranged with each other in the pixel regions adjacent along the vertical direction. In other words, the red and green sub-pixel regions "SPr" and "SPg" are alternately arranged in the first column of the first and third pixel regions "P1" and "P3". In addition, the red and green sub-pixel regions "SPr" and "SPg" are alternately arranged with each other in the first column of the second and fourth pixel regions "P2" and "P4". As a result, in the first column, one green sub-pixel region "SPg" is positioned between two adjacent red sub-pixel regions "SPr".

In the vertically-arranged pixel regions "P1" and "P3" or "P2" and "P4", the same color sub-pixel regions are arranged to be closer than different color sub-pixel regions. For example, when the red and green sub-pixel regions "SPr" and "SPg" are respectively disposed in the first and second rows of the first column in the first pixel region "P1", the green and red sub-pixel regions "SPg" and "SPr" are respectively disposed in the first and second rows of the first column in the third pixel region "P3". In this case, a distance between the red and green sub-pixel regions "SPr" and "SPg" in each of the first and third pixel regions "P1" and "P3" is larger than that between the green sub-pixel region "SPg" in the first pixel region "P1" and the green sub-pixel region "SPg" in the second pixel region "P2".

In addition, the red and green sub-pixel regions "SPr" and "SPg" are alternately arranged with each other in the pixel regions adjacent along the horizontal direction. For example, when the red and green sub-pixel regions "SPr" and "SPg" are respectively disposed in the first and second rows of the first column in the first pixel region "P1", the green and red sub-pixel regions "SPg" and "SPr" are respectively disposed in the first and second rows of the first column in the second pixel region "P2" which is adjacent to the first pixel region "P1" along the horizontal direction.

Similarly, the red and green sub-pixel regions "SPr" and "SPg" are respectively arranged in the first and second rows of the first column in the fourth pixel region "P4". In this case, a distance between the red and green sub-pixel regions "SPr" and "SPg" in each of the second and fourth pixel regions "P2" and "P4" is larger than that between the red sub-pixel region "SPr" in the second pixel region "P2" and the red sub-pixel region "SPr" in the fourth pixel region "P4".

The same color sub-pixel regions are closely arranged and closely arranged sub-pixel regions corresponds to one opening portion of the shadow mask such that a size of each opening portion of the shadow mask and a distance between opening portions of the shadow mask is increased. As a result, a fabrication of the shadow mask becomes further easy.

In addition, by alternately arranging the red and green sub-pixel regions "SPr" and "SPg" along the horizontal direction, a distance between adjacent red sub-pixel regions "SPr" and between adjacent green sub-pixel regions "SPg" is increased such that a fabrication of the shadow mask becomes easy.

The blue sub-pixel region "SPb" is positioned in the second column. Red, green and blue emitting layers 532, 534 and 536 are respectively formed in the red, green and blue sub-pixel regions "SPr", "SPg" and "SPb". The red, green and blue emitting layers 532, 534 and 536 constitute an emitting diode (not shown) with a first electrode (not shown) and a second electrode (not shown). To prevent the shadowing problem, the emitting layers 332, 334 and 336 are spaced apart from each other by a first distance "d1".

Since there is no shadowing problem in the same color emitting layers, the same color emitting layers are spaced apart from each other by a second distance "d2" being smaller than the first distance "d1". For example, the first distance "d1" may be about 22 micrometers.

For example, when the red and green sub-pixel regions "SPr" and "SPg" are respectively disposed in the first and second rows of the first column in the first pixel region "P1" and the green and blue sub-pixel regions "SPg" and "SPr" are respectively disposed in the first and second rows of the first column in the third pixel region "P3", the red and green emitting layers 532 and 534 in the first pixel region "P1" and the green and red emitting layers 534 and 532 in the third pixel region "P3" are spaced apart from each other by the first distance "d1", respectively, and the green emitting layer 534 in the first pixel region "P1" and the green emitting layer 534 in the third pixel region "P3" are spaced apart from each other by the second distance "d2" being smaller than the first distance "d1".

Accordingly, with the same size pixel region, a size of each of the red and green emitting layers 532 and 534 in the third embodiment is larger than a size of each of the red and green emitting layers 232 and 234 in the second embodiment.

Two corners of each of the red and green emitting layers 532 and 534 are removed. In each pixel region, first and second corners of the red emitting layer 532 and second and fourth corners, which respectively face the first and second corners, of the green emitting layer 534 are removed. In other words, when two adjacent same color emitting layers in vertically adjacent two pixel regions are defined one emitting layer group, four outer corners of the one emitting layer group are removed.

For example, when the green emitting layer 534 is disposed in the second row of the first column in the first pixel region "P1" and in the first row of the first column in the third pixel region "P3", four outer corners, i.e., upper two corners of the green emitting layer 534 in the second row of the first column in the first pixel region "P1" and lower two corners of the green emitting layer 534 in the first row of the first column in the third pixel region "P3", of the emitting layer group including two green emitting layers 534 are removed.

The removed portion may be an isosceles triangle having a side of "a". To remove corners of the emitting layers means to change an exposed area of the first electrode through the opening 128a (of FIG. 5) of the bank 128 (of FIG. 5).

Each of the red and green emitting layers 532 and 534 has a rectangular shape, which has a first width "w1" and a third height "h3" larger than the first height "h1" and corners of which are removed. Namely, each of the red and green emitting layers 532 and 534 has a modified hexagonal shape, and the emitting layer group has a modified octagonal shape. The blue emitting layer 536 has the second width "w2" and the second height "h2" being larger than the second width "w2".

In FIG. 14, the first width "w1" is larger than the third height "h3". Alternatively, when the third height "h3" is further increased, the third height "h3" may be larger than the first width "w1".

As mentioned above, in the OELD device 510 according to the fifth embodiment of the present invention, the first and second columns are defined by dividing each of the first to fourth pixel regions "P1" to "P4", and the first and second rows are defined by dividing the first column. The red and green sub-pixel regions "SPr" and "SPg" are alternately arranged in the first column. The red and green sub-pixel regions "SPr" and "SPg" are alternately arranged with each other along the vertical direction and the horizontal direction. In the first column of vertically adjacent pixel regions "P1" and "P3" or "P2" and "P4", the same color sub-pixel regions are arranged to be closer than different color sub-pixel regions. The red, green and blue emitting layers 532, 534 and 536 are respectively formed in the red, green and blue sub-pixel regions "SPr", "SPg" and "SPb".

Accordingly, with compared to the related art OELD device, where three sub-pixel regions are arranged along a direction, there is a margin in reduction of the width of the sub-pixel regions. As a result, there is a margin for requirement of a high resolution. Namely, when an area, e.g., a width and a height, of the red, green and blue sub-pixel regions "SPr", "SPg" and "SPb" is reduced with requirement of a high resolution, there is a margin in reduction of the area of the red, green and blue sub-pixel regions "SPr", "SPg" and "SPb" such that a shadow mask for forming the red, green and blue emitting layers 532, 534 and 536 is easily fabricated.

In addition, the same color sub-pixel regions are closely arranged and closely arranged sub-pixel regions corresponds to one opening portion of the shadow mask such that a size of each opening portion of the shadow mask and a distance between opening portions of the shadow mask is increased. Moreover, by alternately arranging the red and green sub-pixel regions "SPr" and "SPg" along the horizontal direction, a distance between adjacent red sub-pixel regions "SPr" and between adjacent green sub-pixel regions "SPg" is increased. As a result, a fabrication of the shadow mask used for the red and green emitting layers 542 and 544 becomes easy.

Moreover, two corners of each of the red and green emitting layers 532 and 534 are removed such that a distance between adjacent opening portion of the shadow mask for the red and green emitting layers 532 and 534 is increased. As a result, a fabrication of the shadow mask used for the red and green emitting layers 542 and 544 becomes further easy.

Figure 15:
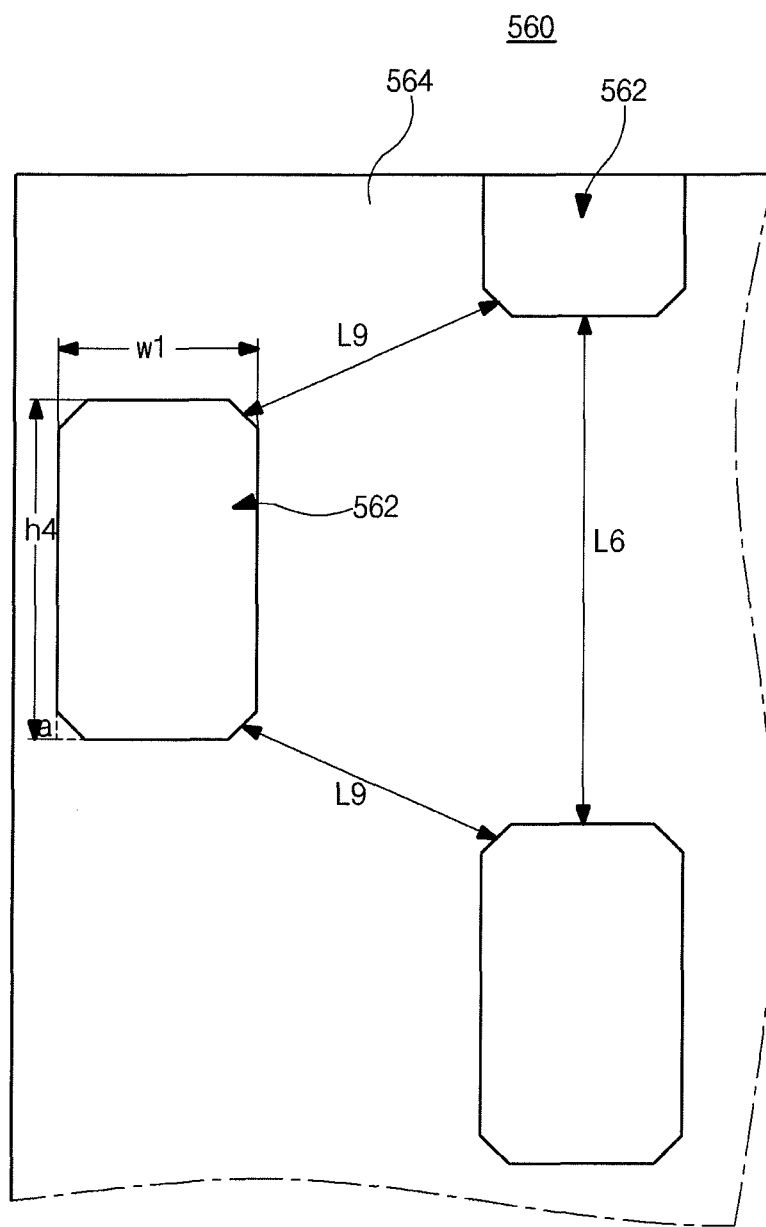
FIG. 15 is a view showing a shadow mask used for red and green emitting layers of an OELD device according to the fifth embodiment of the present invention.

In the OEDL device 510 according to the fifth embodiment of the present invention, the red and green emitting layers 532 and 534 are formed using the above shadow mask. FIG. 15 is a view showing a shadow mask used for red and green emitting layers of an OELD device according to the fifth embodiment of the present invention. The shadow mask used for the blue emitting layer is same as that in the first to third embodiments.

Referring to FIG. 15 with FIG. 14, the shadow mask 560 used for forming the red and green emitting layers 532 and 534 includes a plurality of opening portions 562 for transmitting an emitting material and a blocking portion 564. An align position of the shadow mask 560 for the red emitting layer 532 is different from an align position of the shadow mask 560 for the green emitting layer 534. The shadow mask 560 is moved along a vertical direction or a horizontal direction to form one of the red and green emitting layers 532 and 534 after forming the other of the red and green emitting layers 532 and 534.

Each of the opening portions 562 corresponds to two adjacent red emitting layers 532 or two adjacent green emitting layers 534 in vertically adjacent pixel regions. Each of the opening portions 562 has the first width "w1" and a fourth height "h4". The fourth height "h4" is equal to a summation of twice of the third height "h3" of the red emitting layer 532 or the green emitting layer 534 and the second distance "d2". (h4~2*h3+d2) Alternatively, the fourth height "h4" may be larger than a summation of heights of two adjacent red emitting layers 532 and a distance between two adjacent red emitting layers 532.

Each of the opening portions 562 corresponds to one emitting layer group. Namely, each of the opening portions 562 corresponds to two adjacent red emitting layers 532. Four corners of the rectangular shape are removed such that each of the opening portions 562 has a modified octagonal shape. The removed portion may be an isosceles triangle having a side of "a". For example, "a" may be larger than about 3 micrometers.

Accordingly, the adjacent opening portions 562 in the shadow mask 560 is space apart from each other along a diagonal direction by a ninth length "L9". The ninth length "L9" is larger than the fifth length "L5" (of FIG. 11) as much as twice of a height of removed triangle. (L9~(((w2+2*d1)$^2$+d1$^2$)$^{1/2}$+2*a/2$^{1/2}$) In addition, the adjacent opening portions 562 in the shadow mask 560 is space apart from each other along a vertical direction by a sixth length "L6" corresponding to a summation of twice of the third height "h3" of the red emitting layer 532 or the green emitting layer 534, twice of the first distance "d1" and the second distance "d2". (L6~2*h3+2*d1+d2)

The fourth height "h4" of each opening portion 562 is larger than the first height "h1" of each of the opening portions 162 and 262 in the first and second embodiments, and the sixth length "L6", which is a distance between vertically adjacent opening portions 562, is larger than the second length "L2", which is a distance between vertically adjacent opening portions 162 and 262, in the first and second embodiments.

In addition, the ninth length "L9", which is a diagonal distance between adjacent opening portions 562, is larger than the fifth length "L5", which is a diagonal distance between adjacent opening portions 362 and 462, in the third and fourth embodiments.

Accordingly, a distance between adjacent opening portions 562 and a size of the opening portion 562 are increased, the shadow mask 560 is easily fabricated with a higher resolution. In addition, since the distances between adjacent opening portions 562 along the vertical direction and the diagonal direction become close, a thickness difference of the blocking portion 564 of the shadow mask 560 is reduced such that deformation of the shadow mask 560 is prevented.

As mentioned above, in the OELD device according to the present invention, the red and green sub-pixel regions are alternately arranged in a first column of the pixel region and the blue sub-pixel region is arranged in a second column of the pixel region such that there are advantages in an aperture ratio and a resolution. In addition, the same color sub-pixel regions in vertically adjacent pixel region are closely arranged such that a fabrication of the shadow mask becomes easy.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent display device, comprising:
    first to fourth pixel regions each including red, green and blue sub-pixel regions, each of the first to fourth pixel regions being divided into first and second columns, and the first column being divided into first and second rows, wherein a red sub-pixel region and a green sub-pixel region are respectively arranged in the first and second rows, and a blue sub-pixel region is arranged in the second column;
    a red emitting layer formed in the red sub-pixel region;
    a green emitting layer formed in the green sub-pixel region; and
    a blue emitting layer formed in the blue sub-pixel region, wherein the red sub-pixel region has a first rectangular shape having a first vertical length and a first horizontal length being larger than the first vertical length, and the green sub-pixel region has a second rectangular shape having a second vertical length and a second horizontal length being larger than the second vertical length, and wherein the blue sub-pixel region has a third rectangular shape having a third horizontal length and a third vertical length being larger than the third horizontal length.

2. The device according to claim 1, wherein the red and green sub-pixel regions in horizontally adjacent pixel regions are alternately arranged with each other.

3. The device according to claim 2, wherein a shadow mask used for forming the red and green emitting layers includes a plurality of opening portions corresponding to one of the red and green emitting layers and a blocking portion surrounding the plurality of opening portions.

4. The device according to claim 1, wherein one of the red and green emitting layers is positioned in the second row of the first pixel region and in the first row of the third pixel region, which is vertically adjacent to the first pixel region, and a first distance between two adjacent red emitting layers or two adjacent green emitting layers in the first and third pixel region is smaller than a second distance between the green emitting layer and the red emitting layer in the first pixel region or the third pixel region.

5. The device according to claim 4, wherein a shadow mask used for forming the red and green emitting layers includes a plurality of opening portions corresponding to the two adjacent red emitting layers or the two adjacent green emitting layers and a blocking portion surrounding the plurality of opening portions.

6. The device according to claim 4, wherein the two adjacent red emitting layers or the two adjacent green emitting layers form an emitting layer group, and four outer corners of the emitting layer group is removed such that the emitting layer group has an octagonal shape.

7. The device according to claim 4, wherein a third distance between each of the red and green emitting layer and the blue emitting layer in the first pixel region is equal to the second distance.

8. The device according to claim 1, wherein the blue sub-pixel region includes a deep blue sub-pixel region and a sky blue sub-pixel region, and the blue emitting layer includes a deep blue emitting layer and a sky blue emitting layer respectively formed in the deep blue emitting and the sky blue emitting layer, and wherein the deep blue and sky blue sub-pixel regions are alternately arranged with each other along a vertical direction and a horizontal direction.

9. The device according to claim 8, wherein a shadow mask used for forming the deep blue emitting layer and the sky blue emitting layer includes a plurality of opening portions corresponding to the deep blue emitting layer or the sky blue emitting layer and a blocking portion surrounding the plurality of opening portions.

10. The device according claim 1, further comprising:
    a first electrode under each of the red, green and blue emitting layers;
    a bank on edges of the first electrode and including an opening, wherein the opening exposes a portion of the first electrode; and
    a second electrode on the red, green and blue emitting layers, wherein each of the red, green and blue emitting layers corresponds to the exposed portion of the first electrode.

* * * * *